(12) United States Patent
Ware et al.

(10) Patent No.: US 7,454,555 B2
(45) Date of Patent: Nov. 18, 2008

(54) APPARATUS AND METHOD INCLUDING A MEMORY DEVICE HAVING MULTIPLE SETS OF MEMORY BANKS WITH DUPLICATED DATA EMULATING A FAST ACCESS TIME, FIXED LATENCY MEMORY DEVICE

(75) Inventors: Frederick A. Ware, Los Altos Hills, CA (US); Ely Tsern, Los Altos, CA (US); Steven Woo, Saratoga, CA (US); Richard E. Perego, Thornton, CO (US)

(73) Assignee: Rambus Inc., Los Altos, CA (US)

( * ) Notice: Subject to any disclaimer, the term of this patent is extended or adjusted under 35 U.S.C. 154(b) by 466 days.

(21) Appl. No.: 10/865,398

(22) Filed: Jun. 10, 2004

(65) Prior Publication Data

US 2004/0264286 A1 Dec. 30, 2004

Related U.S. Application Data

(60) Provisional application No. 60/485,341, filed on Jul. 7, 2003, provisional application No. 60/478,133, filed on Jun. 12, 2003.

(51) Int. Cl.
*G06F 12/00* (2006.01)
(52) U.S. Cl. ......................................................... 711/5
(58) Field of Classification Search ...................... 711/5, 711/161, 162, 148, 157; 365/189.05, 230.03, 365/230.08
See application file for complete search history.

(56) References Cited

U.S. PATENT DOCUMENTS 5,497,478 A * 3/1996 Murata ........................ 711/157
6,675,251 B1 * 1/2004 Streitenberger et al. ..... 710/306
6,820,182 B1 * 11/2004 Bauman et al. .............. 711/170
6,839,797 B2 * 1/2005 Calle et al. ...................... 711/5
7,143,234 B2 * 11/2006 Nalawadi et al. ............. 711/114
2002/0069318 A1 * 6/2002 Chow et al. .................. 711/104
2003/0026140 A1 * 2/2003 Blodgett ...................... 365/200
2004/0186945 A1 * 9/2004 Jeter et al. ....................... 711/5
2005/0138276 A1 * 6/2005 Navada et al. ............... 711/105

* cited by examiner

*Primary Examiner*—Hiep T Nguyen
(74) *Attorney, Agent, or Firm*—Vierra Magen Marcus & DeNiro LLP

(57) ABSTRACT

An apparatus includes two multi-bank memory devices for storing duplicate data in each memory bank in an embodiment of the invention. The two memory devices are able to replace a more expensive fast-cycle, fixed latency single memory device. In an embodiment of the invention, a memory controller includes controller logic and a plurality of write buffers for interleaving write transactions to each memory bank in the two memory devices. A memory controller also includes tag memory for identifying valid data in the memory banks. In another embodiment of the invention, a game console includes the apparatus and executes game software that requires fixed latency in a mode of operation. In yet another embodiment of the invention, each memory device is coupled to respective write channels. Write data is simultaneously written to two memory banks in respective sets of memory banks in a memory device in an embodiment of the present invention. In an alternate embodiment of the present invention, an apparatus includes four memory devices for storing duplicate data with each memory device having a set of memory banks. The four memory devices are coupled to a controller by four respective write channels.

37 Claims, 23 Drawing Sheets

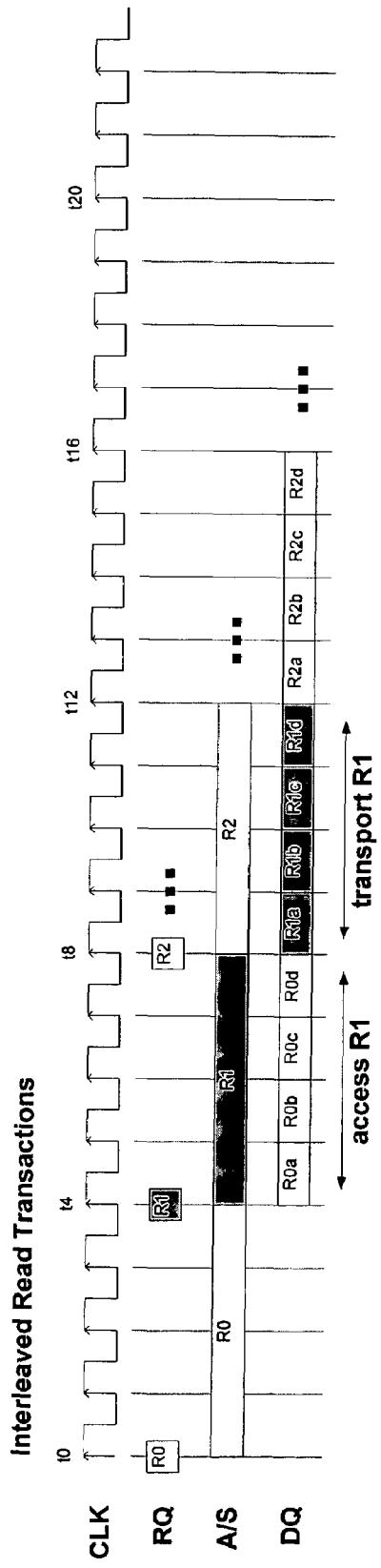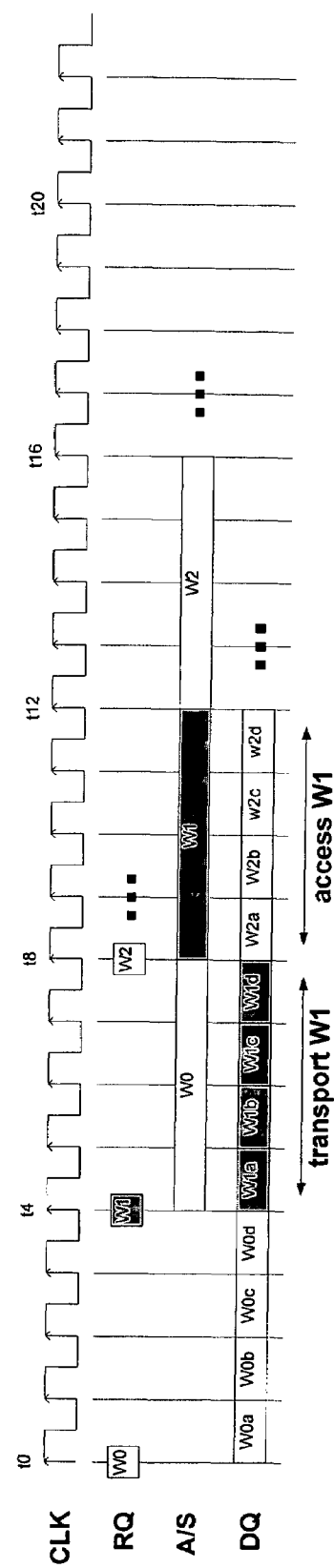
Fig. 2a
Fig. 2b

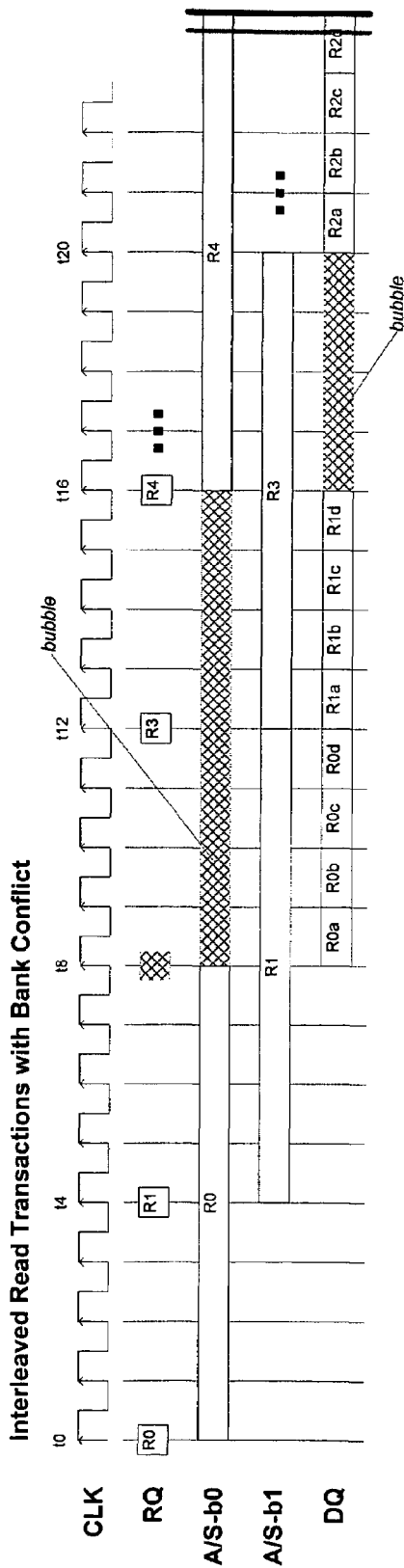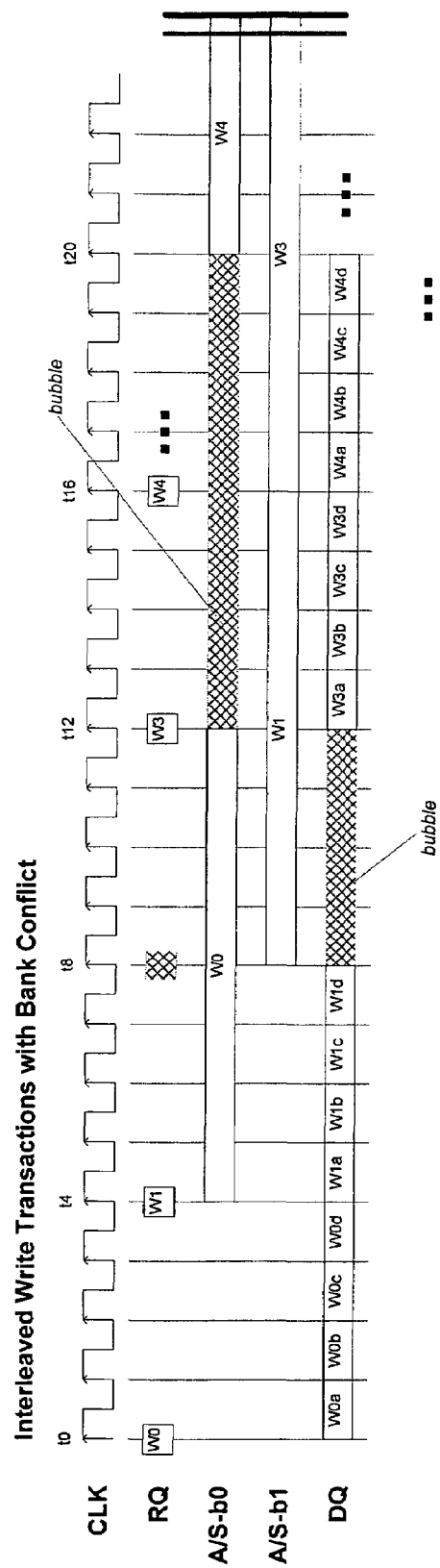

APPARATUS AND METHOD INCLUDING A MEMORY DEVICE HAVING MULTIPLE SETS OF MEMORY BANKS WITH DUPLICATED DATA EMULATING A FAST ACCESS TIME, FIXED LATENCY MEMORY DEVICE

PRIORITY CLAIM

The present application claims priority to U.S. Provisional Patent Application Ser. No. 60/478,133, filed Jun. 12, 2003 entitled, "APPARATUS AND METHOD INCLUDING A MEMORY DEVICE HAVING MULTIPLE BANKS WITH DUPLICATED DATA EMULATING A FAST ACCESS TIME MEMORY DEVICE", and U.S. Provisional Patent Application Ser. No. 60/485,341, filed Jul. 7, 2003, entitled "APPARATUS AND METHOD INCLUDING A MEMORY DEVICE HAVING MULTIPLE SETS OF MEMORY BANKS WITH DUPLICATED DATA EMULATING A FAST ACCESS TIME, FIXED LATENCY MEMORY DEVICE".

FIELD OF THE INVENTION

The present invention relates to the transfer of data in a memory apparatus.

BACKGROUND

A memory apparatus typically includes a master device, such as a memory controller, and a plurality of memory devices for storing data. A user of a memory apparatus is generally interested in being able to store as much data as possible in the memory devices as well as being able to transfer the data to and from the memory devices as fast as possible.

Some memory apparatus include memory devices having a single memory bank. A single bank memory device may be used in the apparatus because single bank memory devices generally have faster access times than multi-bank memory devices. Second, if multi-bank memory devices are used instead of single bank memory devices, the actual throughput of data transferred in the apparatus may be reduced. Memory bank conflict during concurrent read transactions to the same memory bank may cause the actual throughput to be less than the theoretical maximum. Third, an apparatus having multi-bank memory devices generally requires a more complex controller to keep track of read and write transactions to the various memory banks. An apparatus with a single bank memory device often has a fixed latency of transferring data.

While users may prefer the benefits of a memory apparatus having a single bank memory device, single bank memory devices having relatively fast access times are generally more expensive than the slower multi-bank memory devices. Accordingly, when a user wants to upgrade or replace the memory devices in the apparatus, the user has to pay for the more expensive single bank memory devices.

Further, when a user replaces or upgrades the memory devices, the user generally wants to run the same software applications that were previously executed using the previous memory devices.

Therefore, it is desirable to provide an apparatus and method having the software compatibility and benefits of a single bank memory device, without the added cost.

BRIEF DESCRIPTION OF THE DRAWINGS

FIGS. 2a-b are timing diagrams illustrating read and write transactions of the memory device shown in FIG. 1.

FIGS. 5a-b are timing diagrams illustrating read and write transactions with a bank conflict of the memory device shown in FIG. 3.

DETAILED DESCRIPTION

An apparatus includes two multi-bank memory devices for storing duplicate data in each memory bank in an embodiment of the invention. The two memory devices are able to replace a more expensive fast-cycle, fixed latency single memory device. In an embodiment of the invention, a memory controller includes controller logic and a plurality of write buffers for interleaving write transactions to each memory bank in the two memory devices. A memory controller also includes tag memory for identifying valid data in the memory banks.

In another embodiment of the invention, a game console includes the apparatus and executes game software that requires fixed latency in a mode of operation.

In yet another embodiment of the invention, each memory device is coupled to respective write channels. Write data is simultaneously written to two memory banks in respective sets of memory banks in a memory device in an embodiment of the present invention. In an alternate embodiment of the present invention, an apparatus includes four memory devices for storing duplicate data with each memory device having a set of memory banks. The four memory devices are coupled to a controller by four respective write channels.

An access time of a memory device, also known as cycle time or row cycle time ("$t_{RC}$"), is an amount of time required to read or write a set of data from or to a storage location in a bank of a memory device. A transport time is an amount of time required to move the set of data between a memory device and a memory controller.

Figure 1:
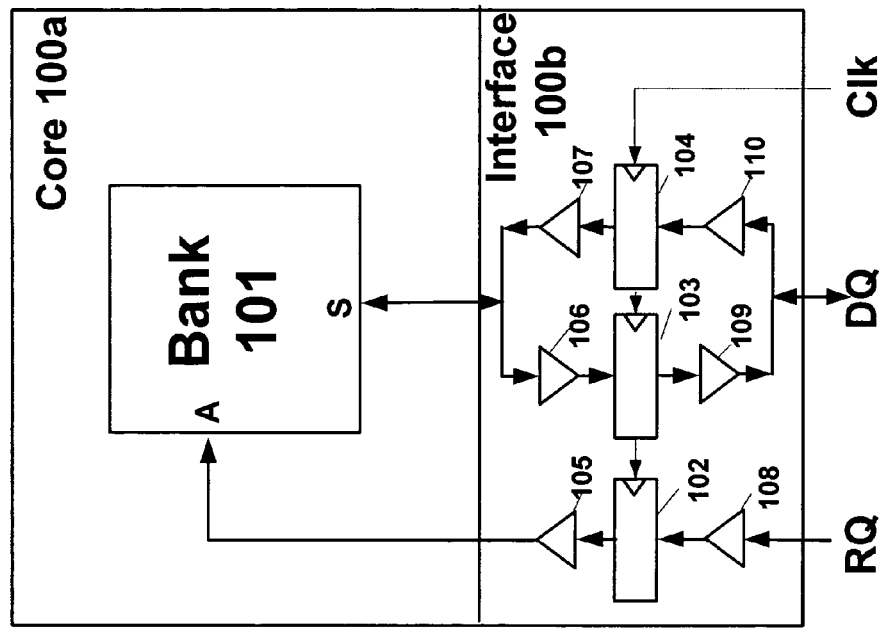
FIG. 1 is a block diagram of a memory device having a memory bank.

FIG. 1 illustrates a memory device 100 having a single bank 101, in a core 100a, and a coupling interface 100b. Bank 101 is a two dimensional array of storage cells and associated circuitry for reading and writing the cells. Memory device 100 includes a bus A for providing control and address signals for addressing a storage location in bank 101. Bus A is coupled to circuitry 105 for coupling interface 100b to core 100a. Pipeline register 102 is coupled to circuitry 105 and receiver 108. Bus RQ is coupled to receiver 108 and carries external control and address signals. Bus S is an internal bidirectional bus for providing read/write data signals to and from the addressed memory location. Bus S is coupled to circuitry 106 and 107 for coupling interface 100b to core 100a. Pipeline registers 103 and 104 are coupled to circuitry 106 and 107, respectively. Transmitter 109 and receiver 110 are coupled to pipeline registers 103 and 104, respectively. An external bus DQ transfers external bidirectional read/write signals and is coupled to transmitter 109 and receiver 110. A CLK line provides a clock signal to registers 102-104 for synchronizing memory device 100 transactions.

The pipeline registers 102, 103, and 104 are used for synchronization of the information between the internal and external buses. Registers 102-104 may also be used for generating delay, as would be required if the internal and external buses used a different number of signals. Although memory device 100 shows a single level (clock cycle) of pipeline registers, two or more levels (clock cycles) of delay are used in an alternative embodiment of the present invention.

FIG. 2a shows a timing diagram illustrating a sequence of read transactions. A read transaction includes generating a READ command having an address of the memory location to be read on bus RQ and transferring the read data signals from bank 101 onto bus DQ in an embodiment of the present invention. In an embodiment of the present invention, READ commands (R0, R1, R2 . . . ), containing address and control information, are received on every fourth rising edge in a four clock cycle memory apparatus. A first READ command R0 is accessed between clock edges 0 and 4, and the read data signal on bus S is loaded into pipeline register 103 and transported between clock edges 4 and 8. In other words, the transport time is also four clock cycles as the data signal is divided into four pieces or sets of data (R0a, R0b, R0c, R0d), and each piece is transported during a clock cycle. This allows the next READ command R1 to perform its access during the transport of the R1 READ command.

Although memory device 100 illustrates a single memory bank, two or more memory banks that do not use overlapped operations are used in an alternative embodiment of the present invention. In other words, if the access times of two successive read transactions do not overlap (even if directed to two different banks), then a two (or more) bank memory device is functionally equivalent to the one bank memory device shown in FIG. 1. An important distinction is whether the access time of successive transactions is overlapped or not overlapped.

An example of a single bank memory device is a "Splash" MoSys® 1T-SRAM memory device manufactured by Monolithic System Technology, Inc, Sunnyvale, Calif., United States of America.

FIG. 2b shows a timing diagram illustrating a sequence of write transactions. A write transaction includes generating a WRITE command having an address of the memory location to be written on bus RQ and transferring the write data signals on bus DQ to the addressed memory location in bank 101 in an embodiment of the present invention. WRITE commands (W0, W1, W2 . . . ), containing address and control information, are received on every fourth rising edge in a four clock cycle memory apparatus. Data signals or a set of data for a first WRITE command W0 is transported between clock edges 0 and 4, and the write data signals are driven onto bus S from pipeline registers 104 and accessed (written to the storage location) between clock edges 4 and 8. In other words, a write access time is also four cycles. This allows the next WRITE command W1 to perform its transport during the access of the W0 WRITE command. Access and transport steps are reversed for read and write transactions.

The timing relationships seen in FIGS. 2a-b represent one method of arranging the timing slots for the RQ, A, S, and DQ buses for the read and write transactions. Other arrangements are possible, but will not affect the important distinction of whether the access times of successive transactions are overlapped or not.

Figure 3:
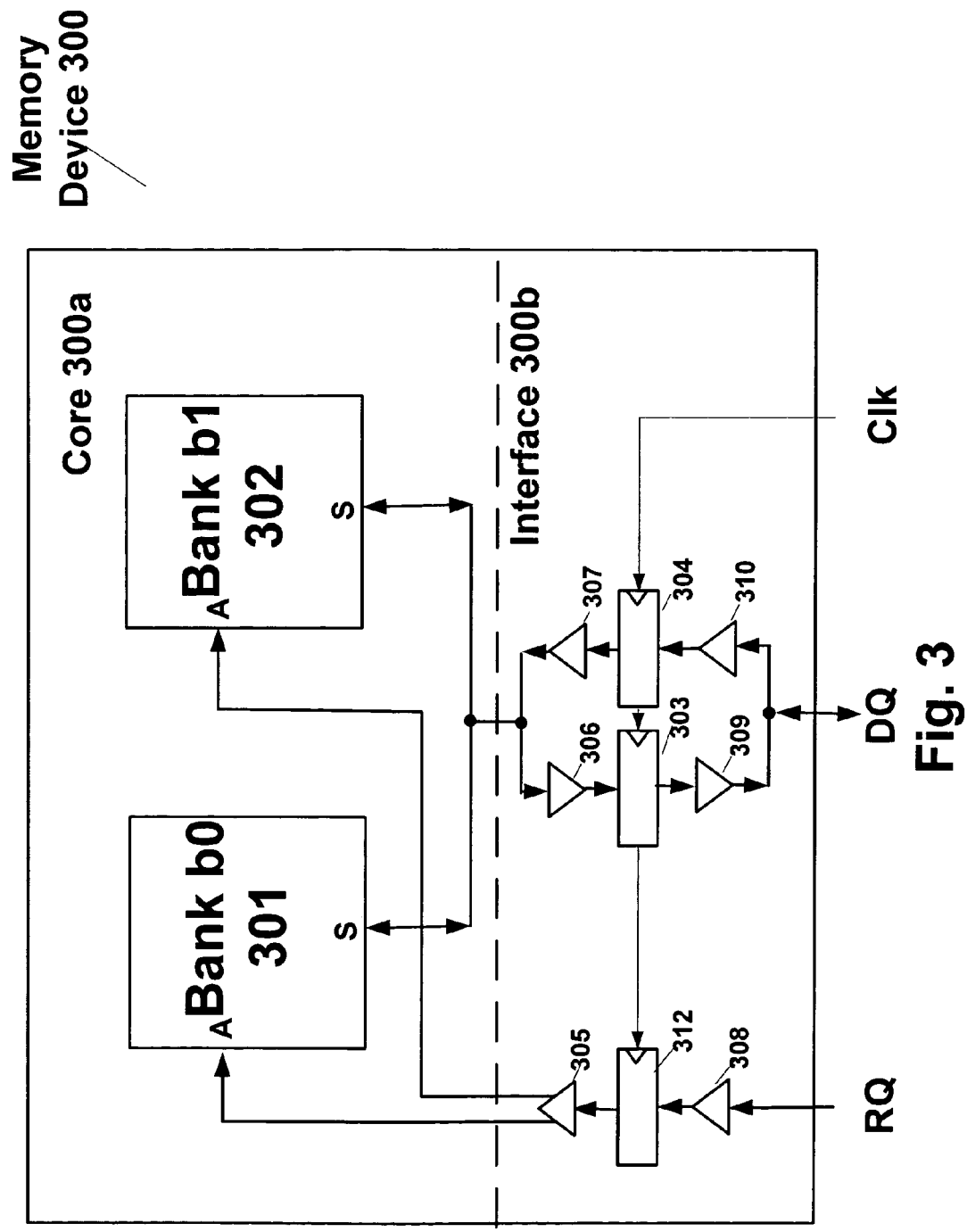
FIG. 3 is a block diagram of a memory device having two memory banks.

FIG. 3 illustrates a memory device 300, having two memory banks b1 301 and b2 302, with a slower access time than memory device 100 shown in FIG. 1. In embodiments of the present invention, memory device 300 is a double data rate 1 ("DDR1"), or a double data rate 2 ("DDR2") memory device.

Banks 301 and 302 are two-dimensional array of storage cells and associated circuitry for reading and writing the cells. In embodiments of the present invention, the memory cells of bank b0 301 and/or b1 302 may be dynamic random access memory ("DRAM") cells, static random access memory ("SRAM") cells, read-only memory ("ROM") cells, or other equivalent types of memory cells.

Memory device 300 includes a bus A for providing control and address signals for addressing a storage location in bank b0 301 or bank b1 302. Bus A is coupled to circuitry 305 for coupling interface 300b to core 300a. Pipeline register 312 is coupled to circuitry 305 and receiver 308. Bus RQ is coupled to receiver 308 and carries external control and address signals.

Bus S is an internal bidirectional bus for providing read/write data signals to and from the addressed memory location of bank b0 301 or b1 302. Bus S is coupled to circuitry 306 and 307 for coupling interface 300b to core 300a. Pipeline registers 303 and 304 are coupled to circuitry 306 and 307, respectively. Transmitter 309 and receiver 310 are coupled to pipeline registers 303 and 304, respectively. An external bus DQ transfers external bidirectional read/write signals and is coupled to transmitter 309 and receiver 310. A CLK line provides a clock signal to pipeline registers 312, 303 and 304 for synchronizing memory device 300 transactions.

The pipeline registers 312, 303 and 304 are used for synchronization of the information between the internal and external buses. Pipeline registers 312, 303 and 304 also may be used for generating delay, as would be required if the internal and external buses used a different number of signals. Although memory device 300 shows a single level (clock cycle) of pipeline registers, two or more levels (clock cycles) of delay are used in an alternative embodiment of the present invention.

Figure 4A:
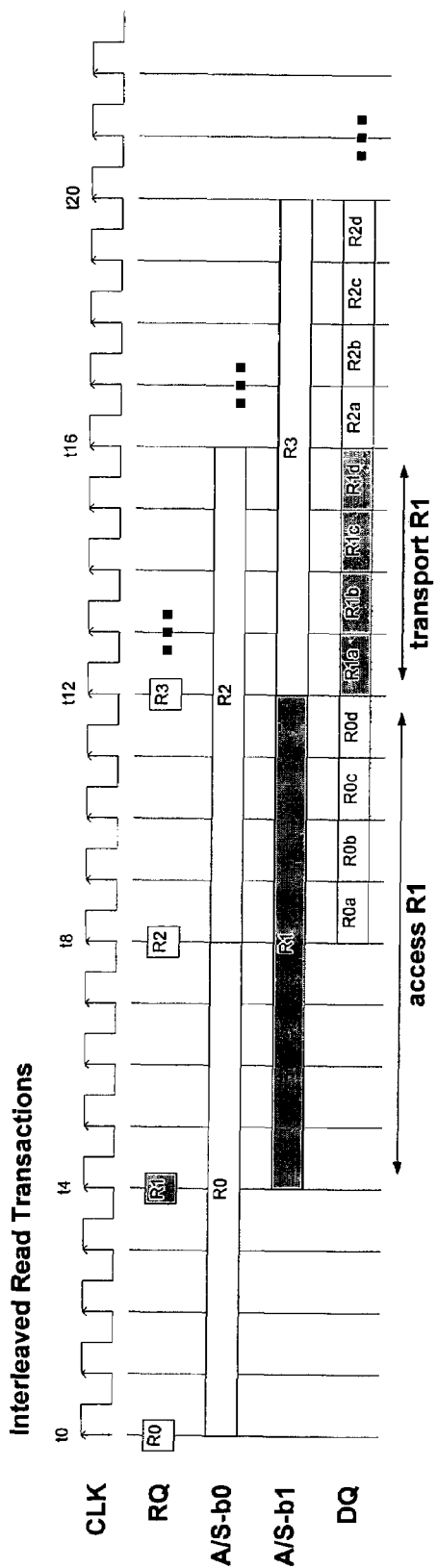
FIGS. 4a-b are timing diagrams illustrating read and write transactions of the memory device shown in FIG. 3.
Figure 4B:
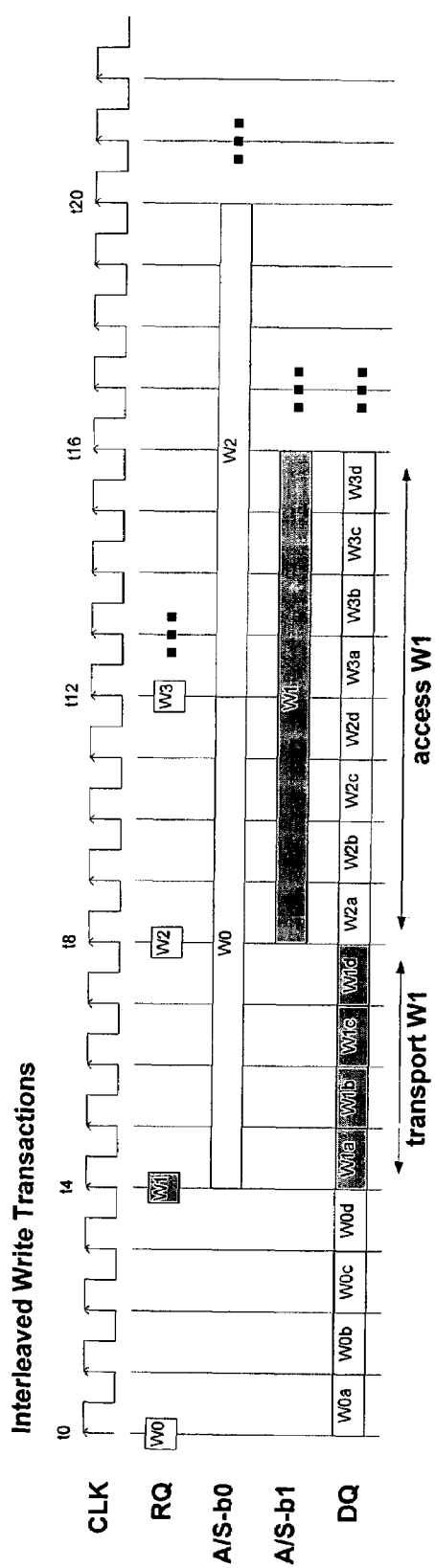

FIG. 4a shows a timing diagram illustrating a sequence of read transactions for the memory device shown in FIG. 3. READ commands (R0, R1, R2, R3 . . . ), containing address and control information, are received on every fourth rising edge in an apparatus where a read access time is 8 clock cycles. The first READ command R0 for bank b0 301 is accessed between clock edges 0 and 8, and the read data signals on bus S are loaded into pipeline register 303 and transported between clock edges 8 and 12 (R0a, R0b, R0c, R0d). In other words, the transport time is four clock cycles.

A second READ command R1 is accessed between clock edges 4 and 12 from bank b1 302, and read data signals on bus S are loaded into pipeline register 303 and transported between clock edges 12 and 16 (R1a, R1b, R1c, R1d). The access steps of the first and second transactions can be overlapped because their addresses select different banks.

A third READ command R2 is accessed between clock edges 8 and 16, and the read data signal on bus S is loaded into pipeline register 303 and transported between clock edges 16 and 20 (R2a, R2b, R2c, R2d). During clock cycles 8 to 12, three transactions are being processed by memory device 300, each at a different step (first-half-access of bank b0 301, second-half-access of bank b1 302 and transport).

Throughput, also known as data bandwidth, of memory device 300 is the same as memory device 100. However, because the access time of memory device 300 is longer due to greater memory cell density, memory device 300 will typically be less expensive to manufacture.

The timing relationships seen in FIGS. 4a-b and 5a-b represent one method of arranging the timing slots for the RQ, A, S, and DQ buses for the read and write transactions. Other arrangements are possible, but will not affect the important distinction of whether the access times of successive transactions are overlapped or not.

A disadvantage of memory device 300 is that memory bank conflict is possible as seen in FIGS. 5a-b. For example, memory bank conflict occurs when two successive READ commands (R1 and R3) must access the same bank b1 302. An access step for READ command R3 must wait until the access step of READ command R1 has completed, and a four-cycle bubble or gap is inserted into the read data stream on bus DQ. Thus, throughput of memory device 300 can be less than the theoretical maximum, and the effective throughput depends upon the distribution of addresses in a command stream.

Because of the possibility of memory bank conflict, some memory apparatus will not use a memory device that overlaps access steps for two successive transactions; only the transport and access steps will be overlapped as illustrated in FIGS. 2a-b. In this memory apparatus, a memory device is being operated as if it effectively has a single memory bank, even though it has multiple banks.

Such memory apparatus tend to have a more limited storage capacity, or a more limited data bandwidth, than a memory apparatus built from slower multi-bank memory devices. However, it would have performance characteristics that were more predictable because of the absence of bank conflicts.

Figure 6:
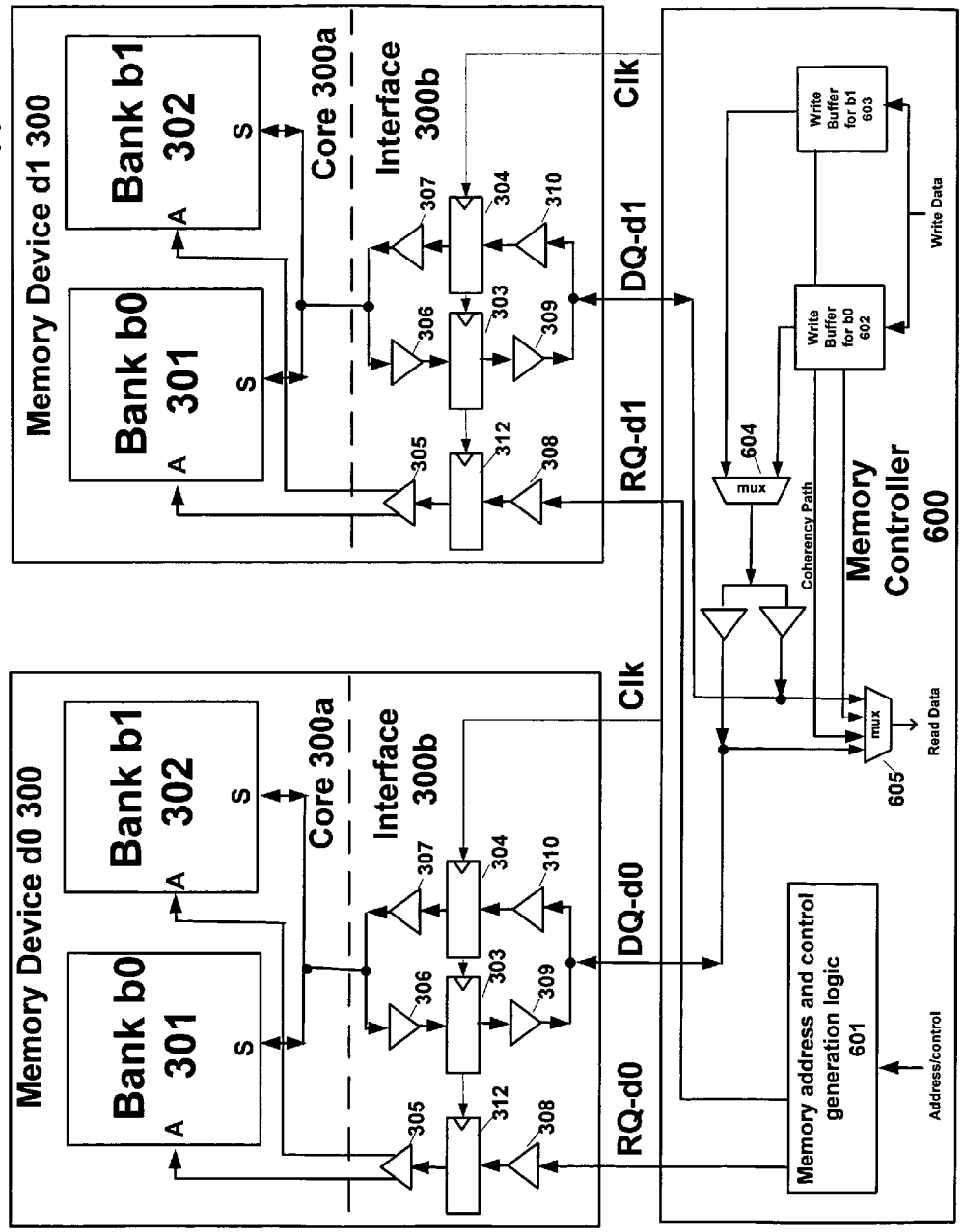
FIG. 6 is a block diagram of an apparatus including two memory devices having two memory banks with duplicated data according to a first embodiment of the present invention.

FIG. 6 shows an apparatus 690 for writing and reading data to and from a plurality of multi-bank memory devices that emulates a single bank memory device. FIG. 6 illustrates a memory apparatus 690 having slave devices, and in particular memory devices d0 300 and d1 300, and a master device, such as a memory controller 600. The contents of memory devices d0 300 and d1 300 are duplicated. Thus, only one-half of the storage capacity can be used.

In FIG. 6, reference numbers refer to like components shown in FIG. 3 and described above for both memory devices d0 300 and d1 300.

External buses RQ d0/d1 and DQ d0/d1 and a Clk line couple memory controller 600 to memory devices d0 300 and d1 300.

In an embodiment of the present invention, buses described herein are interconnects that include a plurality of conducting elements such as a plurality of wires and/or metal traces/lines. In an embodiment of the present invention, external buses include control and data signal lines. In an alternate embodiment of the present invention, external buses include only data lines or only control lines. In still another embodiment of the present invention, an external bus is a unidirectional bus. Circuit components described herein are likewise coupled by a single or multiple interconnects that may be represented in the figures by a single line or multiple lines in embodiments of the invention.

In an alternate embodiment of the present invention, buses RQ-d0 and RQ-d1 are shared, since buses RQ-d0 and RQ-d1 are not simultaneously utilized. In an alternate embodiment of the present invention, buses DQ-d0 and DQ-d1 are shared, since buses DQ-d0 and DQ-d1 are not simultaneously utilized.

In an alternate embodiment of the present invention, buses shown in FIGS. 6, 9, 12, 13, 16 and 19 are used in intrachip, as well as interchip, communications. In an alternate embodiment of the present invention, components shown in FIGS. 6, 9, 12, 13 and 19 are incorporated on an integrated monolithic circuit.

In an alternate embodiment of the present invention, memory devices are positioned on a substrate used in a memory module.

In alternate embodiments of the present invention, a master device is a central processing unit. In alternate embodiments of the present invention, apparatuses 690, 990, 1390, 1690 and 1990 are in a processing device such as a mainframe computer, a desktop computer, a laptop computer, a handheld computer, a network controller, a personal digital assistant, a telephone, a cellular telephone, a game console, a printer, an information appliance, or an equivalent thereof.

Apparatus 690 includes memory devices d0 300 and d1 300 having multiple memory banks; yet, emulates read and write transactions as if memory devices d0 300 and d1 300 were a single bank memory device as seen in FIG. 1. In other words, memory devices d0 300 and d1 300 operate as if they have the approximate fixed latency of a single bank memory device 100. Write transactions are performed for each memory bank in a memory device to ensure duplicate data. Accordingly, apparatus 690 includes memory devices d0 300 and d1 300 that have respective longer access times and are less expensive than a single memory bank memory device, while maintaining at least the same throughput. By having duplicate data in each memory bank, no bank conflict occurs. Write transactions are issued to memory devices d0 300 and d1 300 from memory controller 600, performing interleaved transactions to the two memory banks of each memory device d0 300 and d1 300.

Memory controller 600 is coupled to buses RQ-d0, DQ-d1, RQ-d0, DQ-d1 and clock line CLK in an embodiment of the present invention. Memory controller 600 also includes two memory write buffers 602-603 or write queues in an embodiment of the present invention. In addition, memory controller 600 includes memory address and control generation logic 601 for generating WRITE and READ commands to memory devices d0 300 and d1 300.

Figure 7:
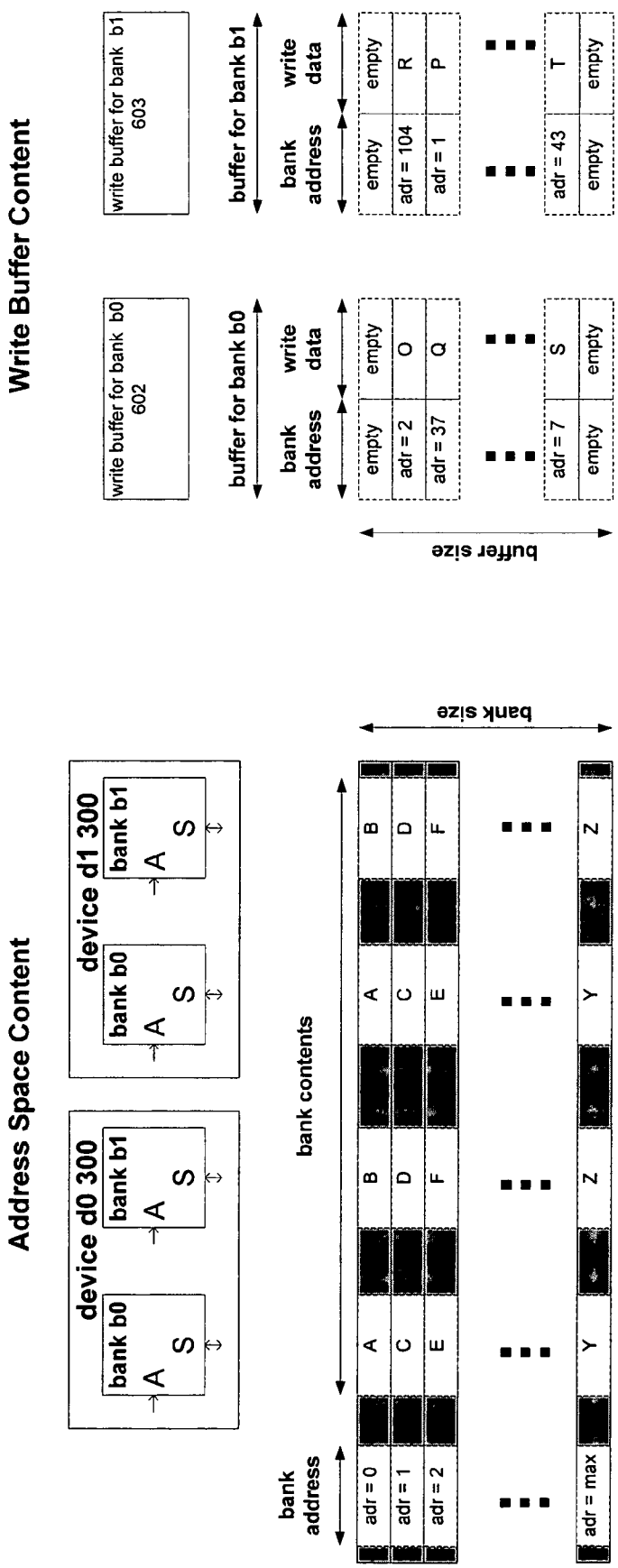
FIG. 7 illustrates address space content and write buffer content of the apparatus shown in FIG. 6 according to the first embodiment of the present invention.

Write data is input to one of two write buffers 602 and 603—one write buffer for memory banks b0 and one write buffer for memory banks b1—as shown in FIGS. 6 and 7. Write data is sent to the selected bank of both devices d0 300 and d1 300 by way of multiplexer 604 and bus DQ-d0/d1.

Memory address and control generation logic 601 initiates a read transaction to either memory device d0 300 or d1 300 on bus RQ-d0/d1. Similarly, memory address and control generation logic 601 initiates a write transaction to both memory devices d0 300 and d1 300 on bus RQ-d0/d1. Address and control information is input to memory address and control generation logic 601.

Read data is received by memory controller 600 on bus DQ-d0/d1 and may also be received from write buffers 602 and 603 on a coherency path. Multiplexer 605 selects the read data from either memory device d0 300 or d1 300, or write buffers 602 or 603.

If the read is to an address for a pending write in one of the write buffers 602 or 603, the read data is returned from the pending write by way of the coherency path. As seen in FIG. 7, if a read is made to address (adr=2) of bank b0 of either memory device d0 300 or d1 300, then the new write data "O" will be returned from the write buffer 602 for bank b0 instead of the old (stale) data E in address (adr=2) of bank b0 of either memory device d0 300 or d1 300.

If the read is made to address (adr=1) of bank b1 of either memory device d0 300 or d1 300, then the new write data "P" will be returned from the write buffer for bank b1 instead of the old (stale) data "D" in address (adr=1) of bank b1 of either memory device d0 300 or d1 300.

In an embodiment of the present invention, entries in the write buffers 602 and 603 are added to the next empty slot (shown with the label "empty"). Write buffers 602 and 603 are emptied from the next full slot (the data "O" and "R", as seen in FIG. 7). This allows write buffers 602 and 603 to be managed with two pointers (one for full and one for empty), which wrap around at a minimum and maximum slot in the write buffer. Such a write buffer is also known as a circular queue.

Figure 8A:
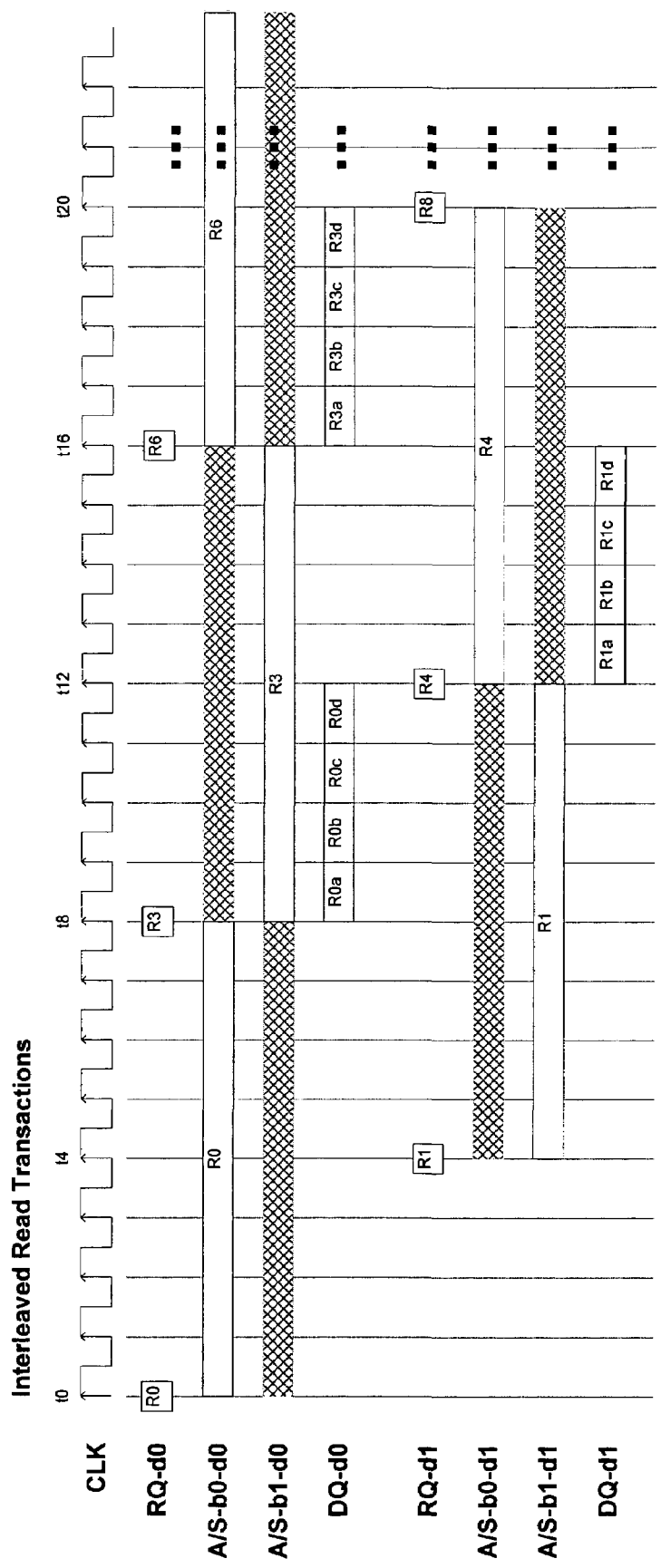
FIGS. 8a-b are timing diagrams illustrating read and write transactions of the apparatus shown in FIG. 6.
Figure 8B:
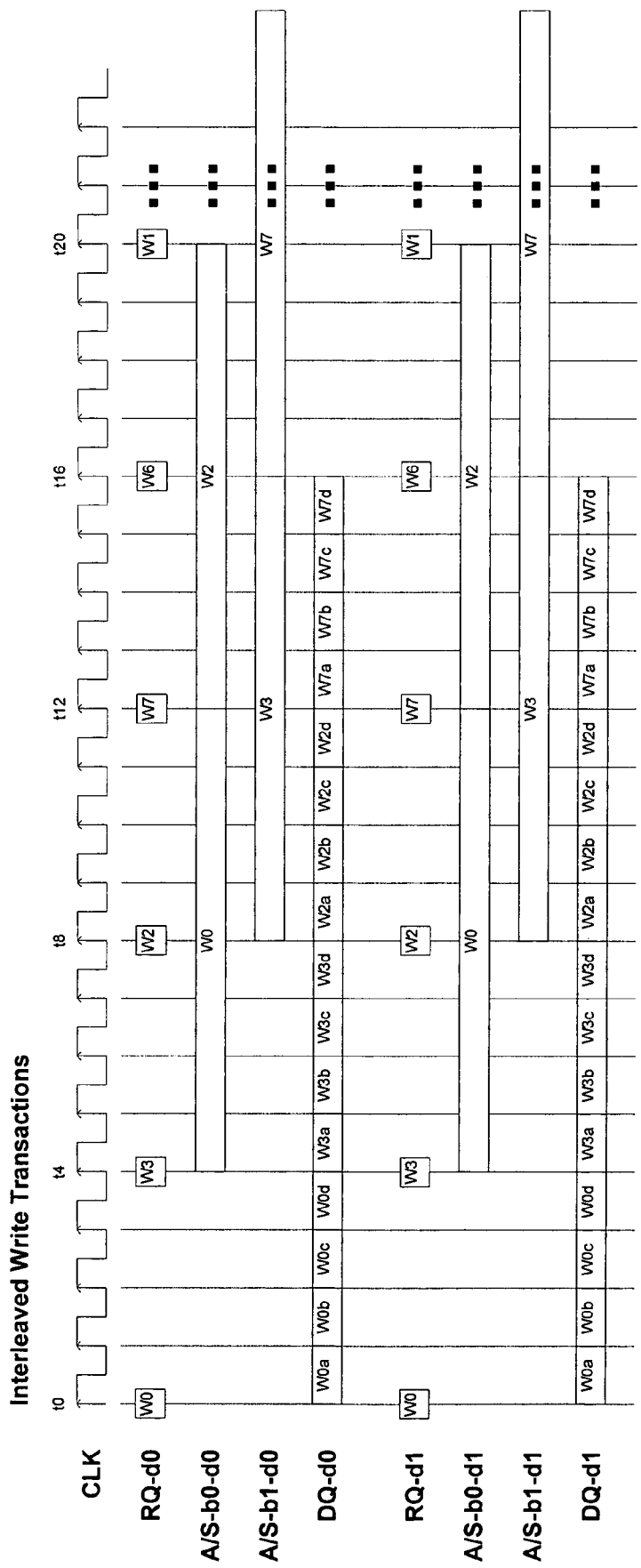

A timing diagram illustrating the read and write transactions of apparatus 690 are shown in FIGS. 8a-b.

FIG. 8a illustrates interleaved read transactions. Memory device d0 300 handles the read transactions in every eighth cycle slot (at t0, t8, t16 . . . ); while memory device d1 300 handles the read transactions in the alternate slots (at t4, t12, t20 . . . ) as seen in FIG. 8a. Cross-hatched slots are not needed, since the data is duplicated in the two memory devices.

FIG. 8b illustrates interleaved write transactions. The same data is written to both memory devices d0 300 and d1 300 into the same bank at the same address (A/S-b0-d0 and A/S-b0-d1). Write buffers ensure that sequential write transactions are directed to alternate banks (b0, b1, b0, b1 . . . ).

There will be enough bandwidth for write transactions as long as no bank conflicts occur. It is easier to reduce bank conflict rate for write transactions than for read transactions.

A read transaction is latency-sensitive; if it is held in memory controller 600, an execution of logic or software elsewhere in apparatus 690 is being starved of read data that it needs in order to proceed. A write transaction is latency-insensitive; if it is held in memory controller 600 (and coherency logic is provided so this held data is returned if a read transaction is made to the affected storage location), the write transaction may be held off indefinitely.

Thus, write transactions are accumulated in two write buffers 602-603, or queues, one for a first memory bank in the memory devices d0/d1 300 and a second for the second memory bank in the memory devices d0/d1 300. This allows writes to be issued out-of-order from the queues so that bank conflicts can be avoided when a burst of write transactions are issued. The deeper the write queues are made, the less likely the chance of a bank conflict and its imposition of bubble cycles.

The approximate relationship between bubble probability and queue depth is:

$$\text{Bubble probability} = [(N-1)/B]^{Q*B}$$

where
N=access time/transport time
B=number of banks
Q=queue depth (per bank)

For this embodiment, N is 2 and B is 2. For a queue depth of 32 entries, the probability of a bubble is about $10^{-20}$. Because of this exponential relationship, it is easy to reduce the chance of a bubble to an arbitrarily small value. Also, it should be noted that the address-matching time of the write buffer (for coherency checking) is not in a critical path, since it will occur in parallel with a normal read transaction.

Figure 9:
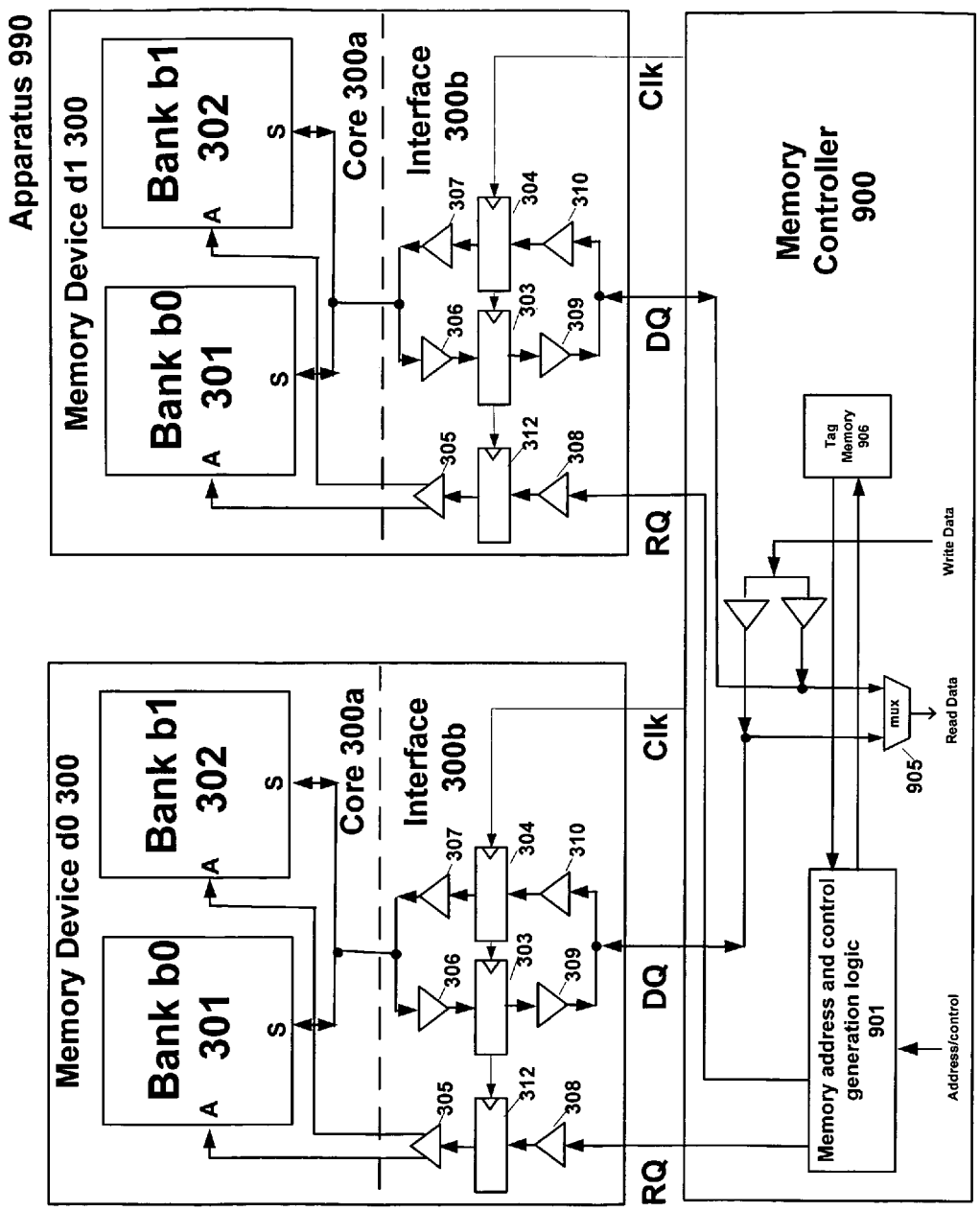
FIG. 9 is a block diagram of an apparatus including two memory devices having two memory banks with duplicated data according to a second embodiment of the present invention.

FIG. 9 illustrates another embodiment of the present invention. FIG. 9, like FIG. 6, illustrates an apparatus 990 having multiple memory devices having two memory banks with duplicated data. In FIG. 9, reference numbers refer to like components shown in FIG. 6 and described above. However, FIG. 9 illustrates an apparatus 990 including a controller 900 having tag memory 906.

At each bank address adr, one of the two following cases is true: adr-b0-d0 is valid; adr-b0-d1 is valid; adr-b1-d0 is invalid and adr-b1-d1 is invalid, or adr-b0-d0 is invalid; adr-b0-d1 is invalid; adr-b1-d0 is valid; adr-b1-d1 is valid. In either case, the valid data at location adr is identical between the two devices. Thus, only one-fourth of the storage capacity can be used.

Memory address and control generation logic 901 initiates a read transaction to either memory device d0 300 or d1 300 on bus RQ. Similarly, memory address and control generation logic 901 initiates a write transaction to both memory devices d0 300 and d1 300 on bus RQ. Memory address and control generation logic 901 reads and writes to tag memory 906. Address and control information is also input to memory address and control generation logic 901.

Write data is provided to memory devices d0 300 and d1 300 by bus DQ as seen in FIG. 9. If a write transaction is to be issued, controller 900 may choose to write the data to either bank b0 of both devices d0 300 and d1 300, or to bank b1 of both devices d0 300 and d1 300. The bank selection is the opposite of the bank that was used in the previous write transaction (this avoids bank conflict). Tag memory 906 is updated with the bank selection, so memory address and control generation logic 901 will know for subsequent read transactions which bank contains valid data and which bank contains invalid data at each address.

Figure 10:
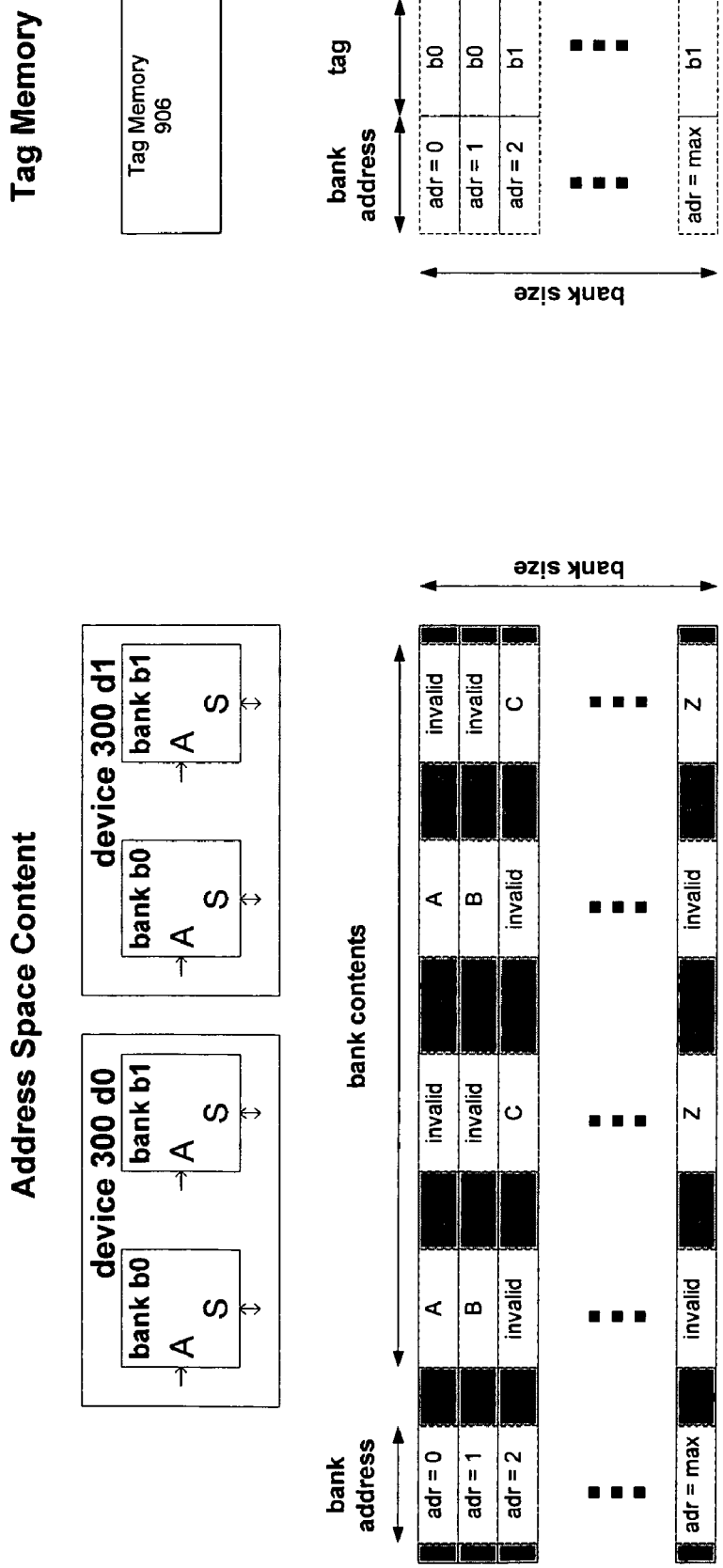
FIG. 10 illustrates address space content and tag memory content of the apparatus shown in FIG. 9 according to the second embodiment of the present invention.

Read data is provided from bus DQ and multiplexed by multiplexer 905. If a read is made to address (adr=1), controller 900 must use bank b0 301 in either memory device d0 300 or d1 300 as seen in FIG. 10. This is because at adr=1, bank b0 of each memory device contains the data "B," and bank b1 of each device is invalid. Memory controller 900 determines that it must read from bank b0 at adr=1 by reading the content of the tag memory 906 at adr=1. The content is a single bit indicating that bank b0 is valid. In an embodiment of the present invention, tag memory 906 has the same number of address locations (each one bit in size) as each bank of the memory devices.

Figure 11A:
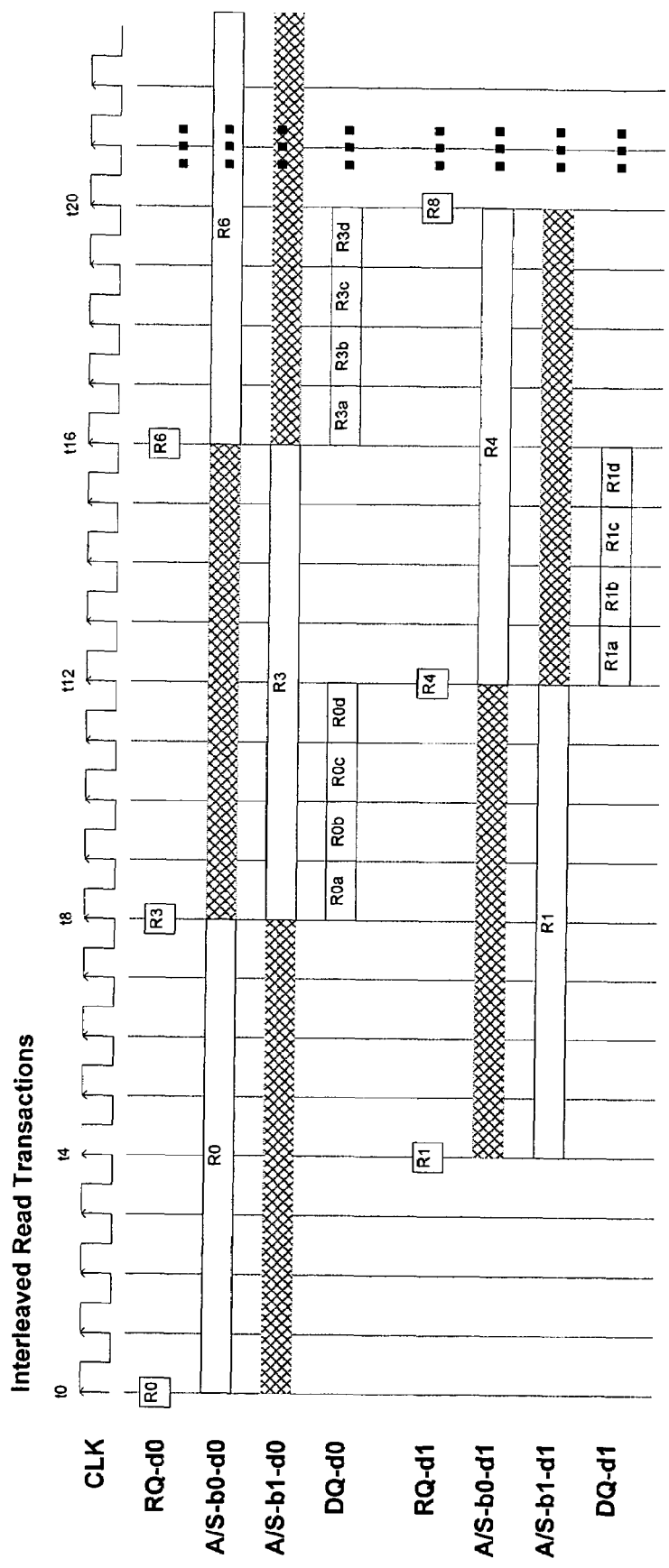
FIGS. 11a-b are timing diagrams illustrating read and write transactions of the apparatus shown in FIG. 9.
Figure 11B:
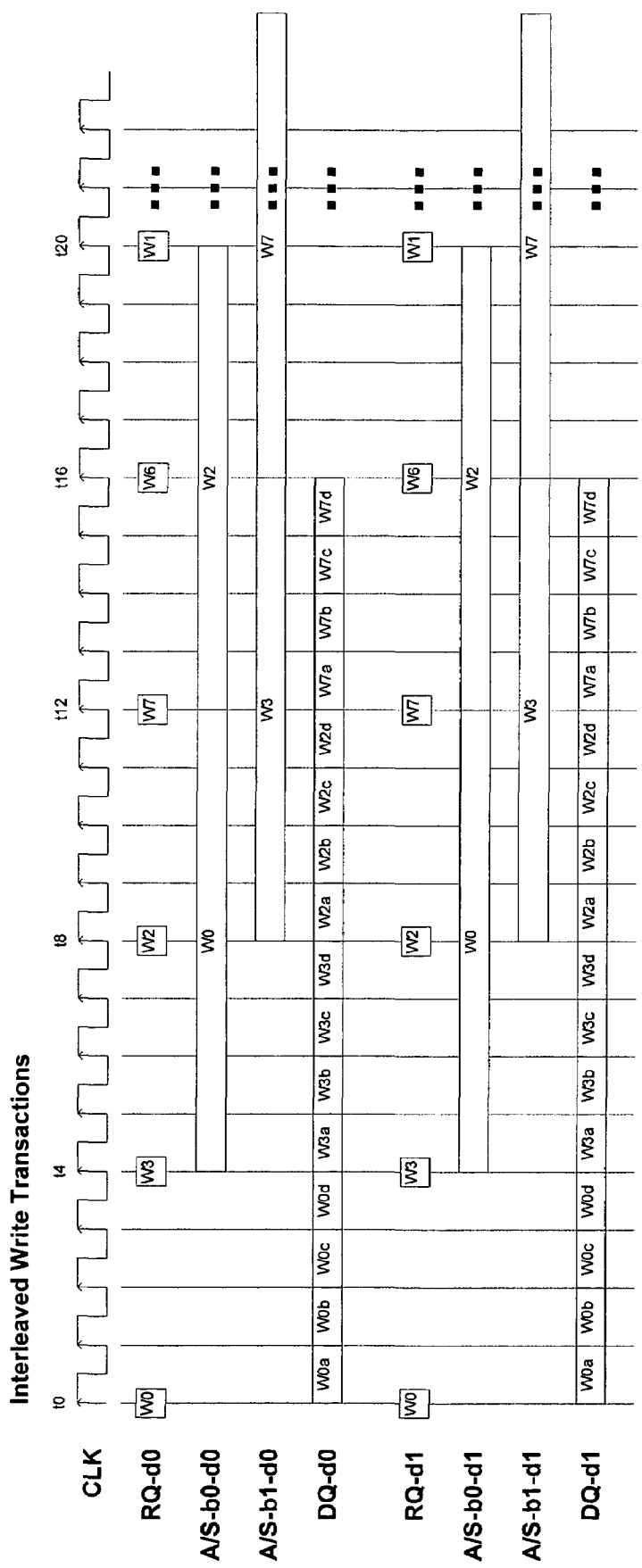

FIGS. 11*a-b* illustrate interleaved read and write transactions of apparatus 990 shown in FIG. 9. FIG. 11*a* shows how bank b0 has valid data at the address associated with READ command R0; bank b1 has valid data at the address associated with READ command R1; bank b1 has valid data at the address associated with READ command R3; bank b0 has valid data at the address associated with READ command R4; and bank b0 has valid data at the address associated with READ command R6. Cross-hatched slots are not needed, since the data is duplicated in memory devices d0 300 and d1 300.

FIG. 11*b* shows interleaved write transactions. The same data is written to both memory devices d0 300 and d1 300 into the same address of either bank b0 or bank b1 (the opposite of the bank used by the previous write transaction). FIG. 11*b* shows how bank b0 is written with valid data at the address associated with WRITE command W0; bank b1 is written with valid data at the address associated with WRITE command W2; bank b0 is written with valid data at the address associated with WRITE command W3; bank b1 is written with valid data at the address associated with WRITE command W7; bank b0 is written with valid data at the address associated with WRITE command W6 and bank b1 is written with valid data at the address associated with WRITE command W1.

Figure 12:
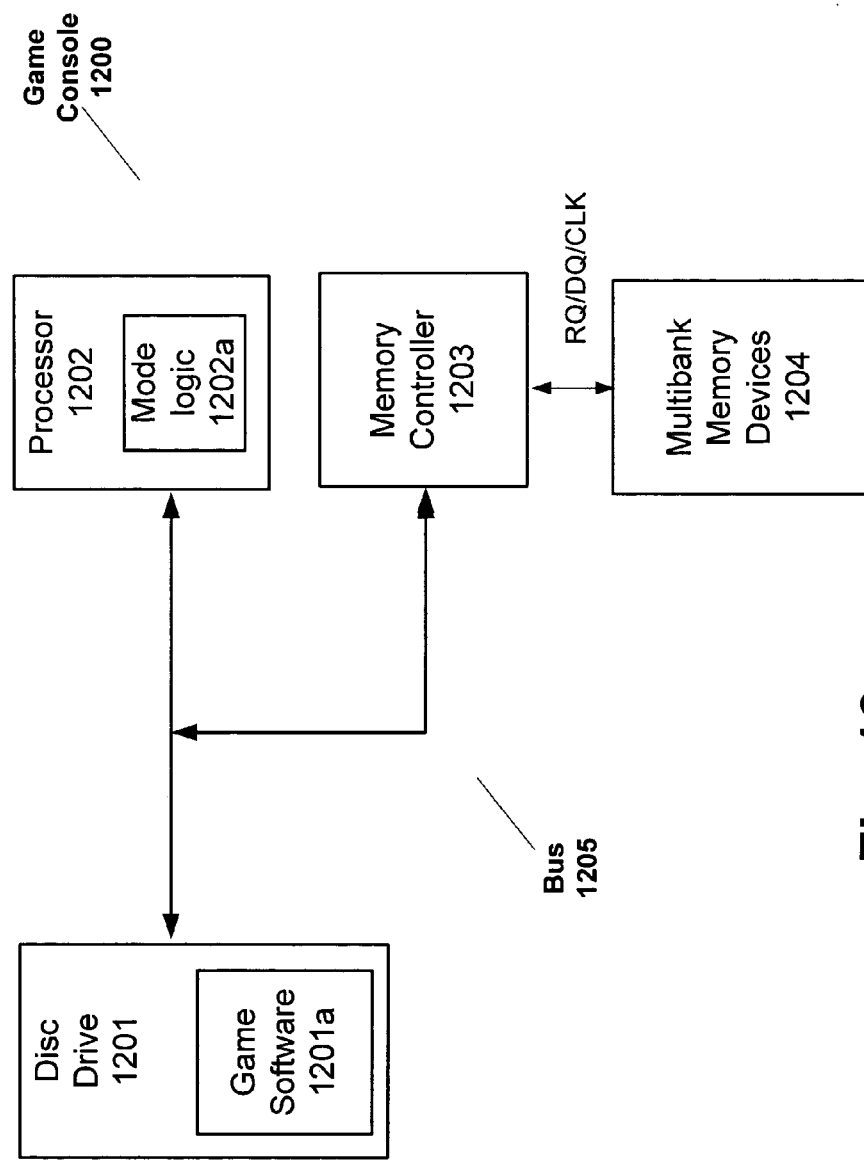
FIG. 12 illustrates a game console embodiment of the present invention.

FIG. 12 illustrates a game console 1200 embodiment of the present invention. In an embodiment of the present invention, game console 1200 is a GameCube Console (Indigo) manufactured by Nintendo®. Game console 1200 includes a disk drive 1201 for inserting a compact disk read-only memory ("CD-ROM") storing game software 1201*a*. In alternate embodiments of the present invention, other equivalent storage media and drives may be used to store and read game software 1201*a*. In an alternate embodiment of the present invention, game software 1201*a* is downloaded from a network or the Internet. Game software 1201*a* includes machine readable executable instructions that are played by a user or executed by game console 1200 in an embodiment of the invention.

Processor 1202 is coupled to disk drive 1201 by bus 1205. Processor 1202 includes mode logic 1202*a* that determines the version of game software 1201*a* or in what mode game console 1200 needs to operate in playing game software 1201*a*. In an embodiment of the present invention, the function of mode logic 1202*a* is carried out by software. Mode logic 1202*a* then generates a mode signal to controller 1203 by way of bus 1205 when game software 1201*a* is an older or "legacy" version. In an embodiment of the present invention, a mode signal is input to memory address and control generation logic 601 and/or 901. As described above, controller 1203 is coupled to multibank memory devices 1204 by a CLK line as well as buses RQ and DQ.

Controller 1203 then generates duplicate data from game software 1201*a* on multibank memory devices 1204 as described herein in order to accommodate the fixed latency requirement of game software 1201*a*. Game console 1200 is then able to operate in a mode emulating a single memory bank memory device architecture. If mode logic 1202*a* determines that game software 1201*a* is not an older version, a mode signal is not generated by processor 1202 to controller 1203. Controller 1203 then does not write duplicate data from game software 1201*a* to memory device 1204 and game software 1201*a* is able to use the extra memory available by not duplicating data. Thus, game console 1200 is able to run an older game software that requires fixed latency as well as recent game software that can take advantage of extra memory.

Figure 13:
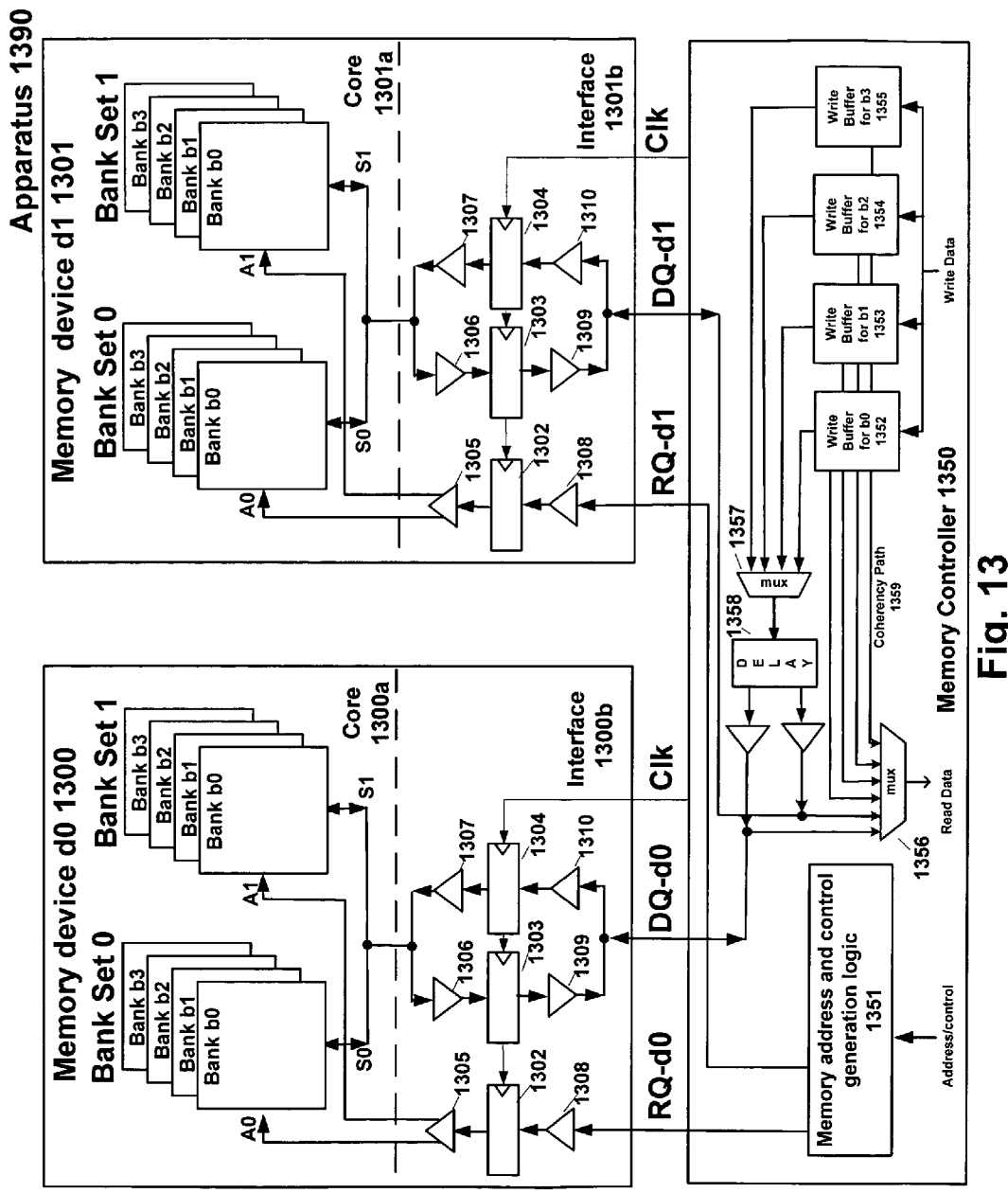
FIG. 13 is a block diagram of an apparatus including two memory devices having two sets of memory banks with duplicated data according to an embodiment of the present invention.

FIG. 13 is a block diagram of an apparatus 1390 including two memory devices d0 1300 and d1 1301, with duplicated data, having two sets of memory banks that emulate a fixed latency memory device according to an embodiment of the present invention. As described above, memory devices d0 1300 and d1 1301 operate as if they have the approximate fixed latency of a single bank memory device 100. Memory devices d0 1300 and d1 1301 each include at least two memory bank sets 0 and 1 in cores 1300*a* and 1301*a*, respectively. Contents of both memory bank sets 0 and 1 of each memory device 1300 and 1301 are identical, thus only one-fourth of the available storage capacity can be used in an embodiment of the present invention. Memory devices d0 1300 and d1 1301 have a slower access time than memory device 100 shown in FIG. 1. In an embodiment of the present invention, memory devices d0 1300 and d1 1301 are extreme data rate ("XDR") memory devices.

Memory bank sets 0 and 1 each include a plurality of memory banks with each memory bank having a two-dimensional array of storage cells and associated circuitry for reading and writing the cells. In embodiments of the present invention, the memory cells in a memory bank of memory bank sets 0 or 1 may be DRAM cells, SRAM cells, ROM cells, or other equivalent types of memory cells.

Memory device d0 1300, like memory device d1 1301, includes buses A0 and A1 for providing control and address signals for addressing a storage location in a memory bank of memory bank sets 0 and 1, respectively. Buses A0 and A1 are coupled to circuitry 1305 for coupling interfaces 1300*b* and 1301*b* to cores 1300*a* and 1301*a*, respectively. Pipeline register 1302 is coupled to circuitry 1305 and receiver 1308. Bus RQ-d0 is coupled to receiver 1308 and carries external control and address signals.

Buses S0 and S1 are internal bidirectional buses for providing read/write data signals to and from the addressed memory location of a memory bank in memory bank sets 0 and 1, respectively. Buses S0 and S1 are coupled to circuitry 1306 and 1307 for coupling interfaces 1300*b* and 1301*b* to cores 1300*a* and 1301*a*, respectively. Pipeline registers 1303 and 1304 are coupled to circuitry 1306 and 1307, respectively. Transmitter 1309 and receiver 1310 are coupled to pipeline registers 1303 and 1304, respectively. An external bus DQ transfers external bidirectional read/write signals and is coupled to transmitter 1309 and receiver 1310. A CLK line provides a clock signal to registers 1302-1304 for synchronizing memory device 1300 transactions.

The pipeline registers 1302, 1303, and 1304 are used for synchronization of the information between the internal and external buses. Pipeline registers 1302-1304 also may be used for generating delay, as would be required if the internal and external buses used a different number of signals. Although memory devices d0 1300 and d1 1301 show a single level (clock cycle) of pipeline registers, two or more levels (clock cycles) of delay are used in an alternative embodiment of the present invention.

FIG. 13 also shows a master device, such as a memory controller 1350, for writing duplicate data to memory devices d0 1300 and d1 1301.

External buses RQ-d0, RQ-d1, DQ-d0, DQ-d1 and Clk line couple memory controller 1350 to memory devices d0 1300 and d1 1301.

Memory controller 1350 also includes four memory buffers 1352-1355 or write queues in an embodiment of the present invention. In addition, memory controller 1350 includes memory address and control generation logic 1351 for generating WRITE and READ commands to memory devices d0 1300 and d1 1301. A read transaction is directed to either memory bank set 0 or memory bank set 1 of either memory device d0 1300 or d1 1301. A write transaction is directed to both memory bank sets 0 and 1 of both memory devices d0 1300 and d1 1301 in an embodiment of the present invention.

Figure 14:
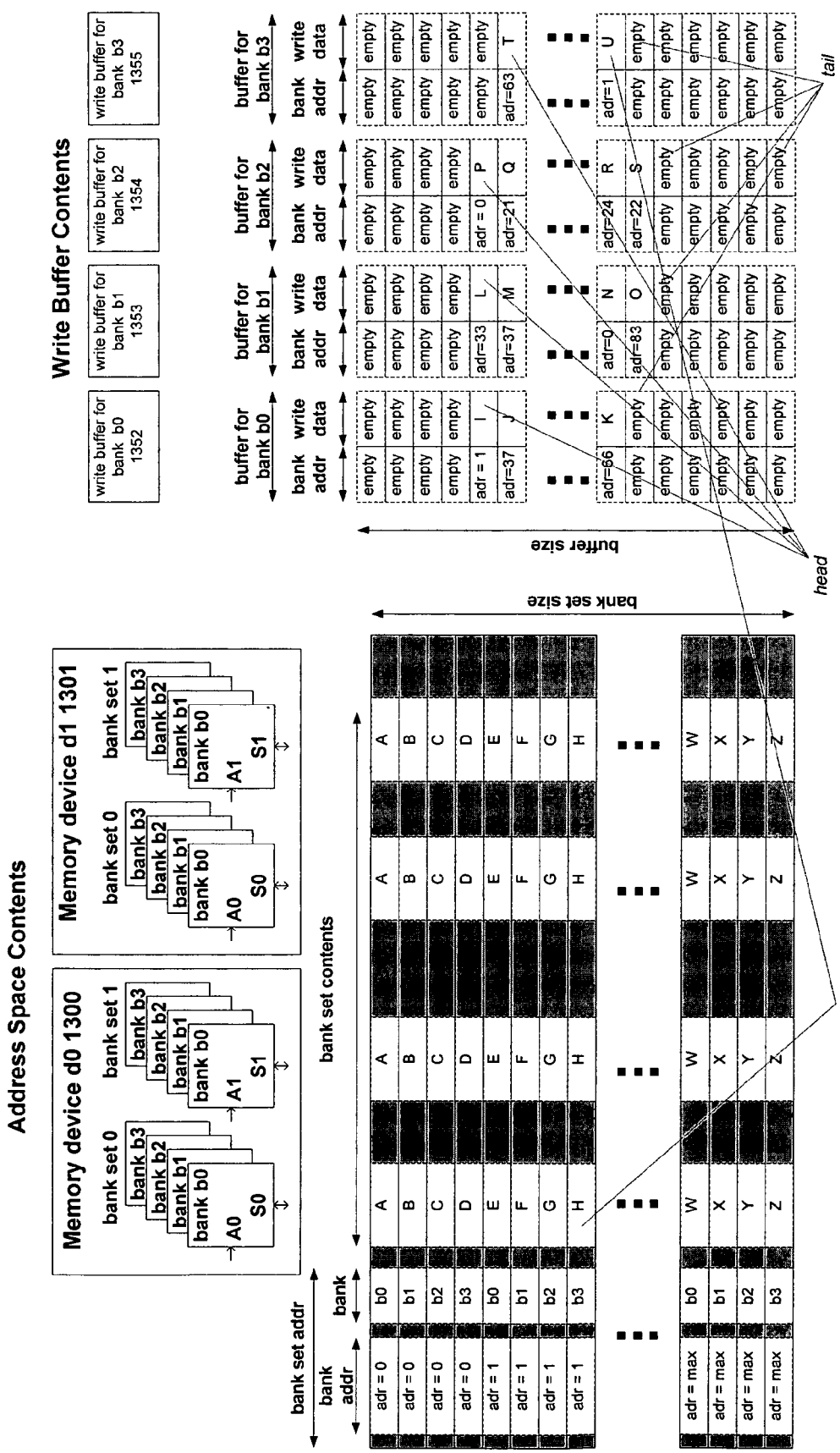
FIG. 14 illustrates address space content and write buffer content of the apparatus shown in FIG. 13 according to the first embodiment of the present invention.

Write data is input to one of four write buffers 1352-1355—one write buffer for memory banks b0, one write buffer for memory banks b1, one write buffer for memory bank b2 and one write buffer for memory bank b3 as shown in FIGS. 13 and 14. Write data is sent to the selected bank of both memory devices d0 1300 and d1 1301 by way of multiplexer 1357, delay 1358 and bus DQ-d0/d1. Write data is sent, with a staggered delay, to the selected bank of all four memory bank sets in memory devices d0 1300 and d1 1301 by delay 1358.

Multiplexer 1356 selects the read data to be output from either memory device d0 1300 or d1 1301. If a read data is to an address for a pending write in one of the write buffers 1352-1355, the read data is returned from the pending write buffer via coherency path 1359. For example, as seen in FIG. 14, if a read is made to address (adr=1) of memory bank b3 of either memory device 1300 or 1301, new write data "U" will be returned from write buffer for memory bank b3 1355 instead of the old (stale) data "H" in address (adr=1) of memory bank b3 of either memory bank sets 0 or 1 of either memory device 1300 or 1301.

FIG. 14 illustrates address space content in memory bank sets 0 and 1 in memory devices d0 1300 and d1 1301 and write buffer content in the four write buffers 1352-1355 of the memory controller 1350 shown in FIG. 13 according to an embodiment of the present invention. In an embodiment of the present invention, each write buffer is a circular queue. Write data is added to the next empty location in write buffers 1352-1355 (shown with the label "empty" and indicated by the label "tail"). A write buffer is emptied from the next full location (the write data "I", "L", "P", and "T" shown in FIG. 14). This allows each write buffer 1352-1355 to be managed with two respective pointers (a first pointer for a "head" and a second pointer for a "tail") that wrap around at the minimum and maximum limits in each write buffer.

Figure 15A:
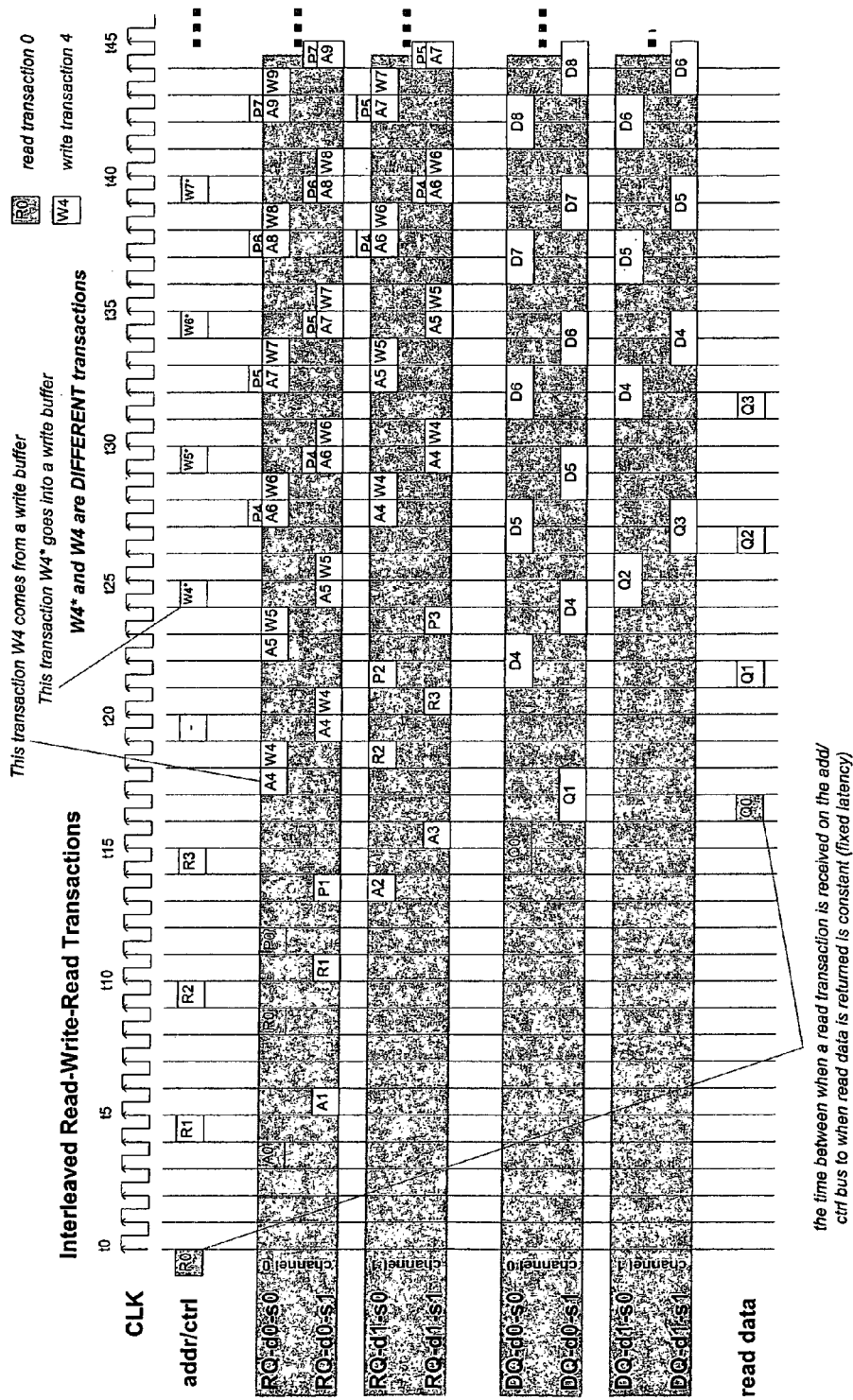
FIGS. 15a-b are timing diagrams illustrating read and write transactions of the apparatus shown in FIG. 13.
Figure 15B:
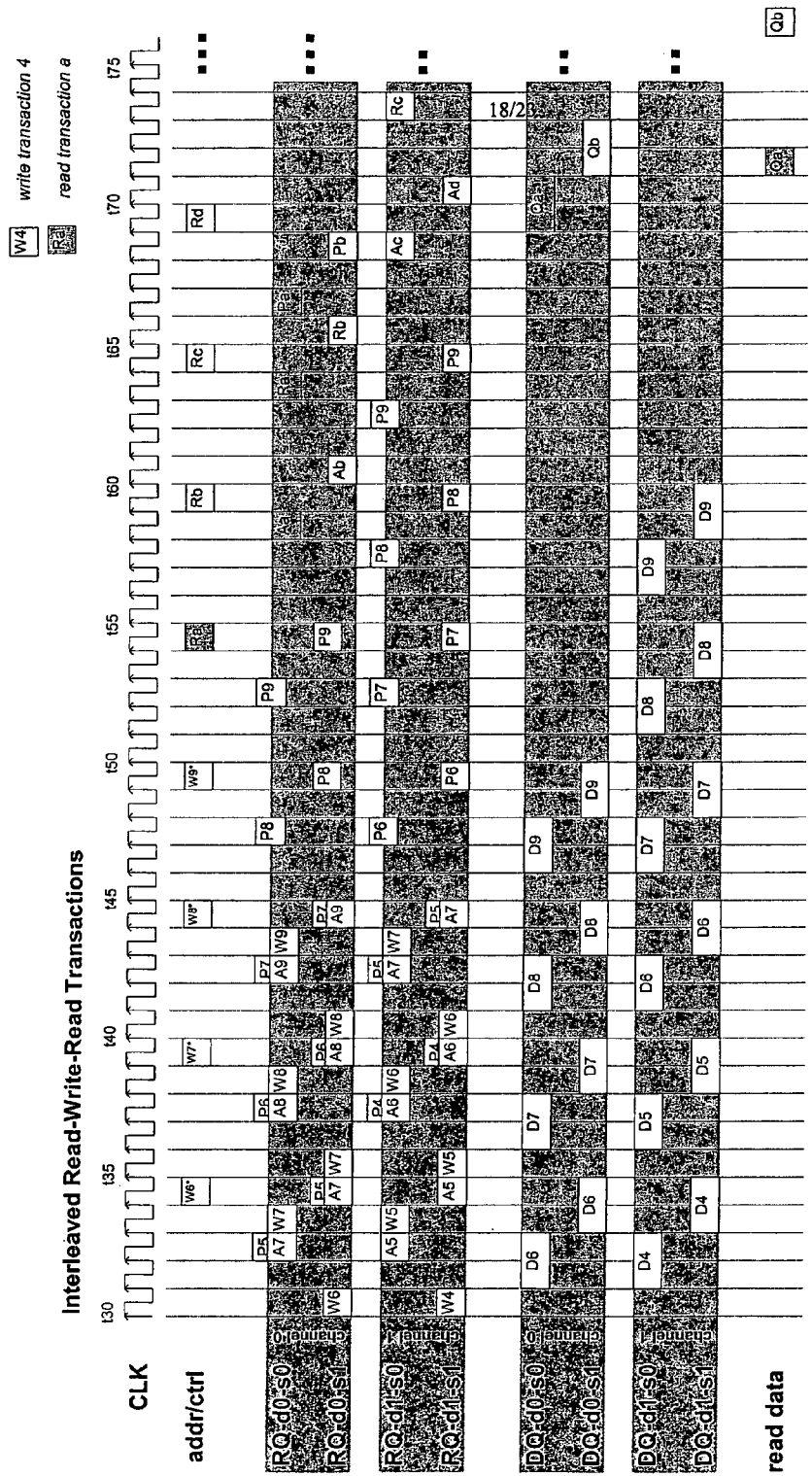

FIGS. 15a-b are timing diagrams illustrating read and write transactions of apparatus 1390 shown in FIGS. 13 and 14. The timing diagrams shown in FIGS. 15a-b illustrate how multi-set memory bank memory devices d0 1300, d1 1301 and memory controller 1350 operate to emulate an apparatus containing a memory device having a single memory bank with a fixed latency. For example, a READ transaction for reading data R0 is asserted at the input of memory device d0 1300 before the first cycle time slot. Then, ACTIVATION command A0 for transaction R0 is asserted on bus RQ-d0-s0 in memory device d0 1300 in the third cycle time slot. Read command R0 is input to memory bank set 0 on bus RQ-d0-s0 in the eighth cycle time slot. Read data is then output on bus DQ-d0-s0 as read data Q0 in the 14$^{th}$ and 15$^{th}$ cycle time slots and received by memory controller 1350 in the 16$^{th}$ cycle time slot. The time difference between when a read transaction R0 is received on an addr/ctrl bus to when read data Q0 is returned at the "Read Data" internal bus of the memory controller 1350 is constant or has an approximate fixed latency. Thus, read and write transactions are handled at fixed intervals regardless of which memory bank is addressed.

Figure 16:
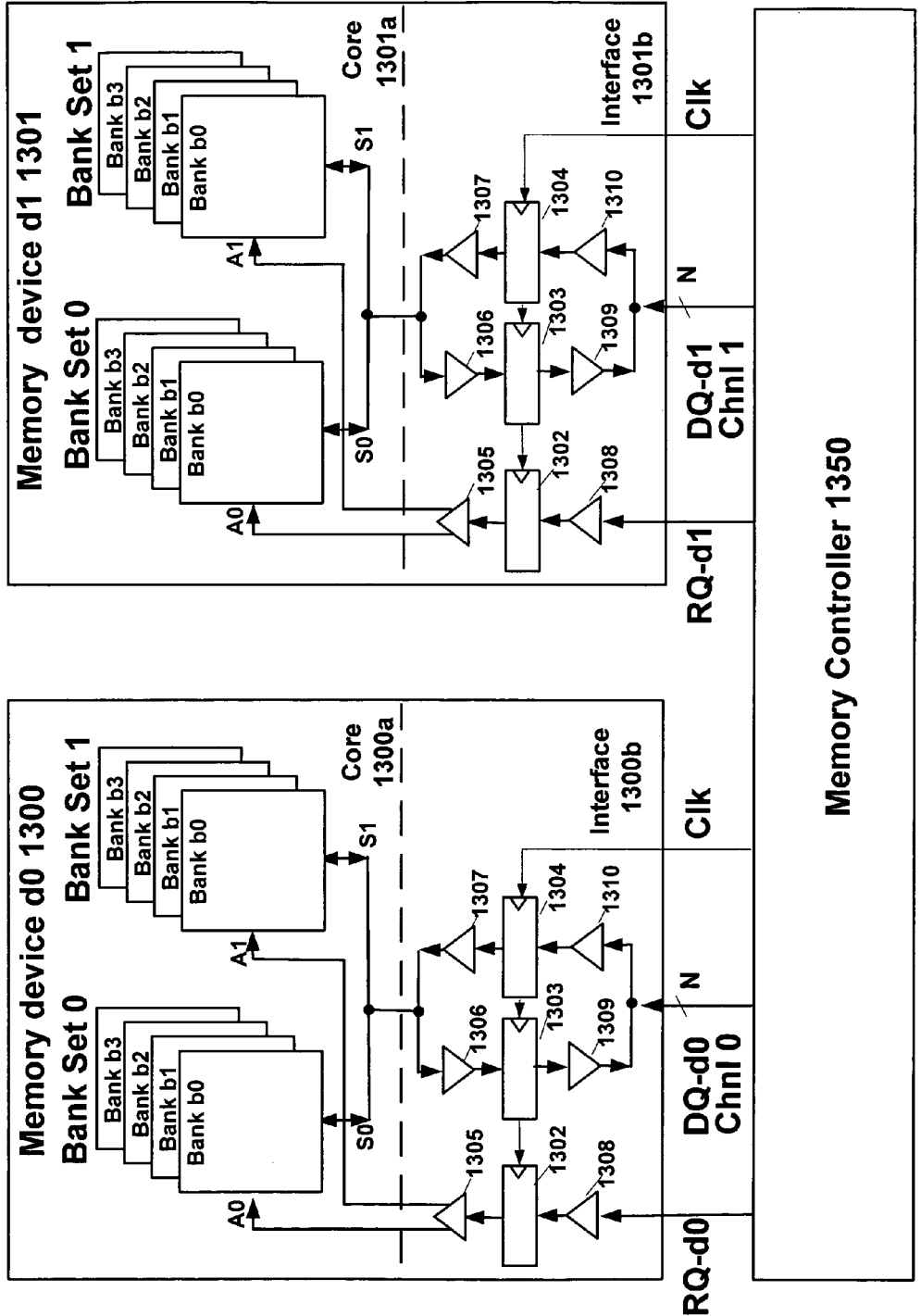
FIG. 16 is a block diagram of an apparatus including two memory devices having two sets of memory banks with duplicated data and two write channels according to an embodiment of the present invention.

FIG. 16 is a block diagram of an apparatus 1690 including two memory devices, with duplicated data, having two sets of memory banks and two independent write channels or buses labeled DQ-d0 and DQ-d1, according to an embodiment of the present invention. Two memory devices 1300 and 1301, as described above, have two sets of memory banks that emulate a fixed latency, single memory bank device according to an embodiment of the present invention. Like reference numbers in FIG. 16 refer to like components described above. Likewise, apparatus 1690 includes memory controller 1350, as described above, in an embodiment of the present invention.

Figure 17:
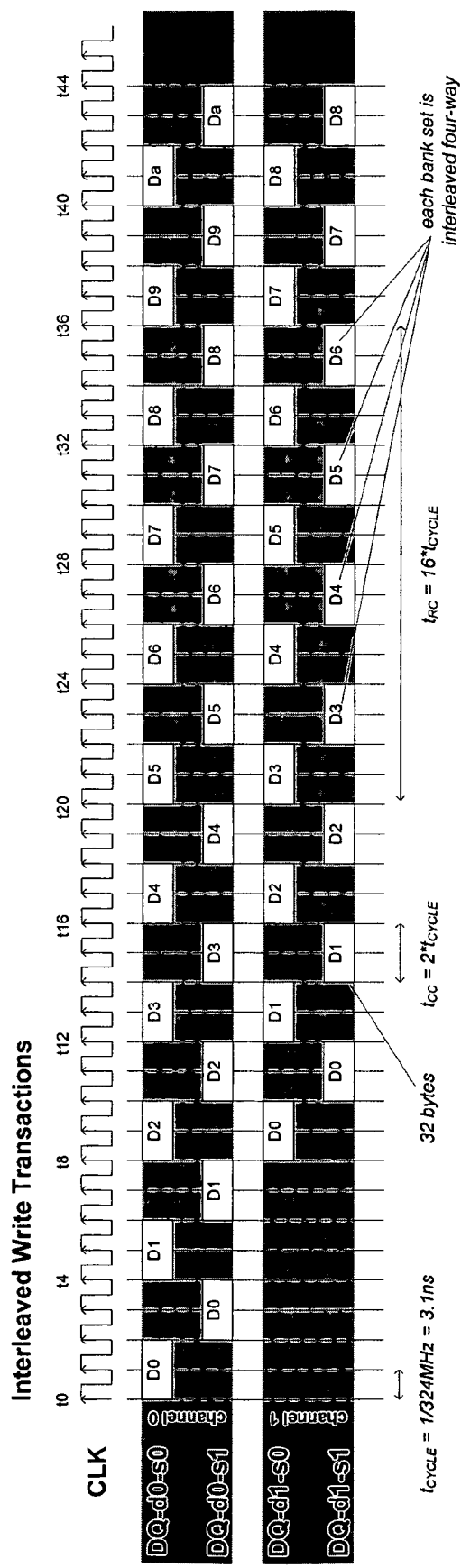
FIG. 17 is a timing diagram illustrating write transactions of the apparatus shown in FIG. 16.

32 bytes of write data is written into each memory bank set in each four-cycle time interval, as illustrated by FIG. 17, in an embodiment of the present invention. A cycle time $t_{CYCLE}$ is $\frac{1}{324}$ Mhz or approximately 3.1 ns in an embodiment of the present invention. A row cycle time $t_{RC}$ is 16 cycles or approximately 50 ns. Thus, each memory bank set will have four staggered write transactions in process during every 16 cycles.

In apparatus 1690, memory controller 1350 alternates writing to the two memory bank sets 0 and 1 in each memory device 1300 and 1301 on each independent write channel DQ-d0 and DQ-d1, respectively, as illustrated by FIG. 17. Accordingly, the column cycle time $t_{cc}$ is equal to $2*t_{cycle}$ or approximately 6.2 ns.

The aggregate data rate, combining the data rates of write channel DQ-d0 and DQ-d1, is 5184 MB/s (16×324). In an embodiment of the present invention, the width N of each write channel 0 and 1, is 16 bits which allows for a data rate for each bit to be 2592 Mb/s (8*324). In an alternate embodiment of the present invention, the width N of each write channel 0 and 1 is 32 bits that allows for a data rate for each bit to be 1296 Mb/s (4*324).

Figure 18:
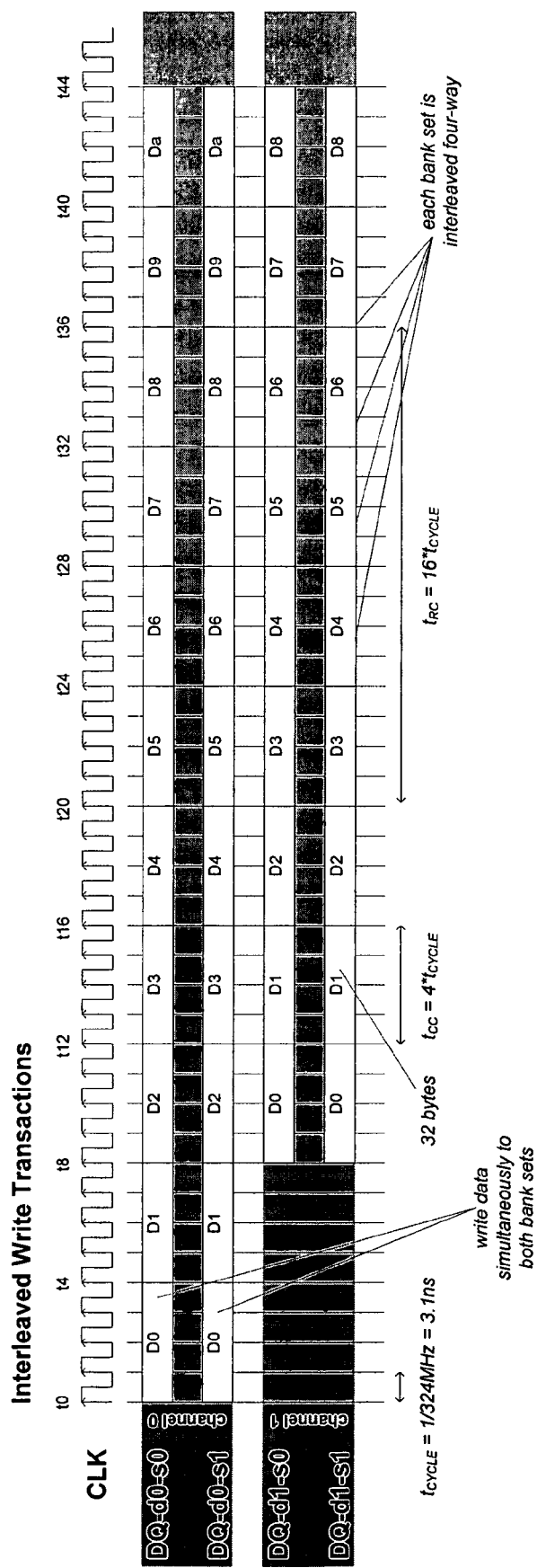
FIG. 18 is a timing diagram illustrating simultaneous write transactions to a memory device of the apparatus shown in FIG. 16.

FIG. 18 is a timing diagram illustrating simultaneous write transactions to both memory bank sets in either memory device d0 1300 or d1 1301 of apparatus 1690 shown in FIG. 16. This operation of apparatus 1690 reduces the data rate on each write channel 0 and 1. A column cycle time $t_{CC}$ is four-cycle times $t_{cycle}$ or approximately 12.4 ns. Accordingly, each write channel 0 and 1 transfers 32 bytes in 12.4 ns, so the aggregate data transfer rate is 2595 MB/s (8*324). In an embodiment of the present invention, the width N of each write channel 0 and 1 is 8 bits that allows for a data rate for each bit to be 2592 Mb/s (8*324). In an alternate embodiment of the present invention, the width N of each write channel 0 and 1 is 16 bits that allows for a data rate for each bit to be 1296 Mb/s (4*324). In an alternate embodiment of the present invention, the width N of each write channel 0 and 1, is 32 bits which allows for a data rate for each bit to be 648 Mb/s (2*324).

Figure 19:
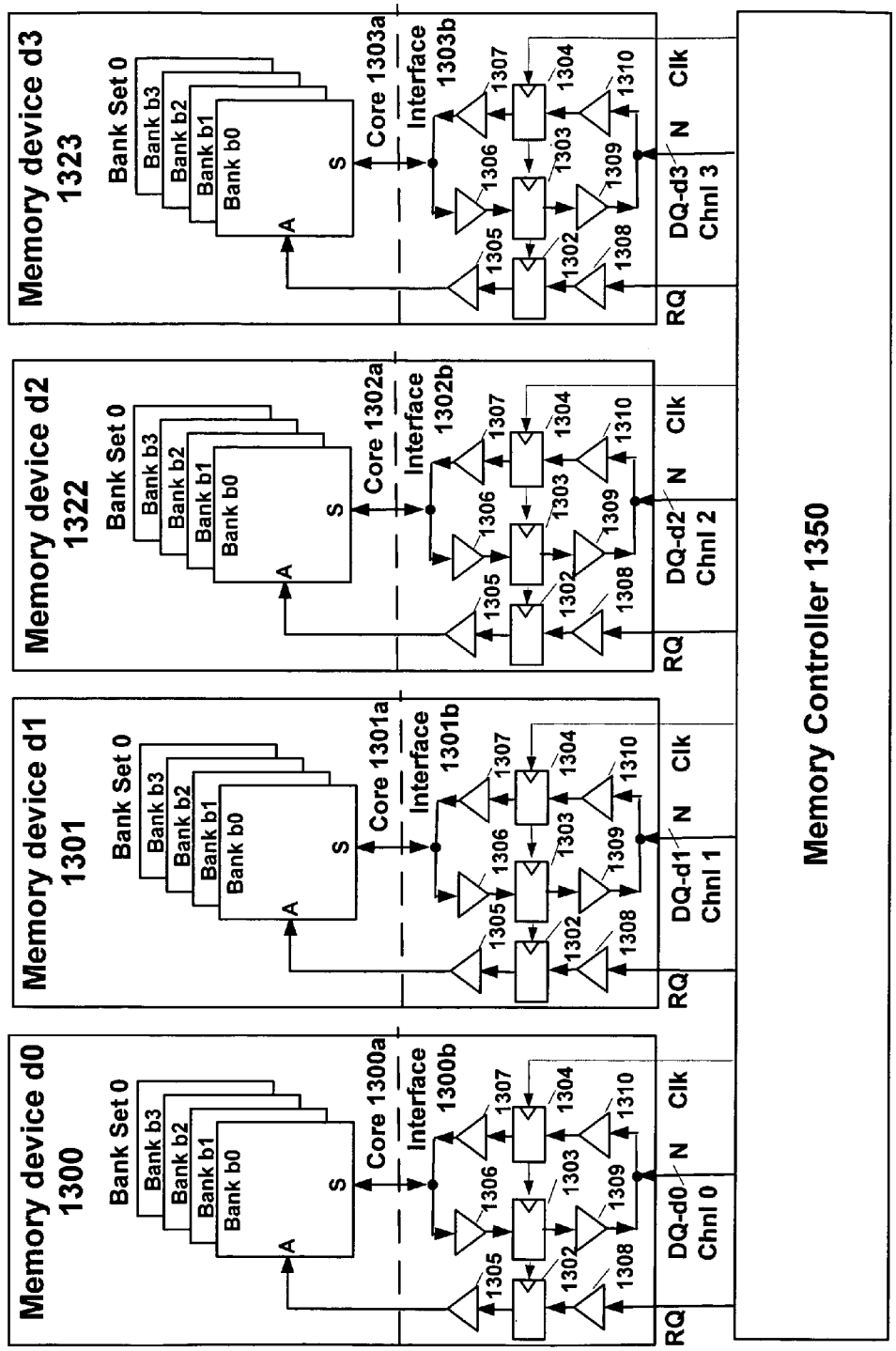
FIG. 19 is a block diagram of an apparatus including four memory devices having sets of memory banks with duplicated data and four write channels according to an embodiment of the present invention.

FIG. 19 is a block diagram of an apparatus 1990 including four memory devices d0 1300, d1 1301, d2 1322 and d3 1323 having respective sets of memory banks with duplicated data according to an embodiment of the present invention. The apparatus 1990 shown in FIG. 19 requires only four memory banks, rather than eight memory banks in an embodiment of the present invention. Also, apparatus 1990 allows for reduced data rate on each write channel 0, 1, 2 and 3 coupled to memory controller 1350.

Memory devices d0 1300, d1 1301, d2 1322 and d3 1323 each have a set of memory banks that in combination emulate a fixed latency, single memory bank device according to an embodiment of the present invention. As described above, memory devices d0 1300, d1 1301, d2 1322 and d3 1323 operate as if they have the approximate fixed latency of a single bank memory device 100. Memory devices d0 1300, d1 1301, d2 1322 and d3 1323 are similar to memory devices d0 1300 and d1 1301 shown in FIG. 16 where like reference numbers refer to like components described above. Memory devices d2 1322 and d3 1323 have cores 1302a and 1303a, as well as interfaces 1302b and 1303b, that operate similar to cores 1300a-1301a and interfaces 1300b and 1302b. Likewise, apparatus 1990 includes memory controller 1350, as described above, in an embodiment of the present invention. However unlike apparatus 1390, memory devices d0 1300, d1 1301, d2 1322 and d3 1323 shown in FIG. 19 each have a single set of memory banks and a single internal bus A and S. Further unlike apparatus 1390, memory controller 1350 shown in FIG. 19 is coupled to memory devices d0 1300, d1 3101, d2 1322, d3 1323 by four independent write channels or buses labeled as DQ-d0, DQ-d1, DQ-d2 and DQ-d3, respectively.

Figure 20:
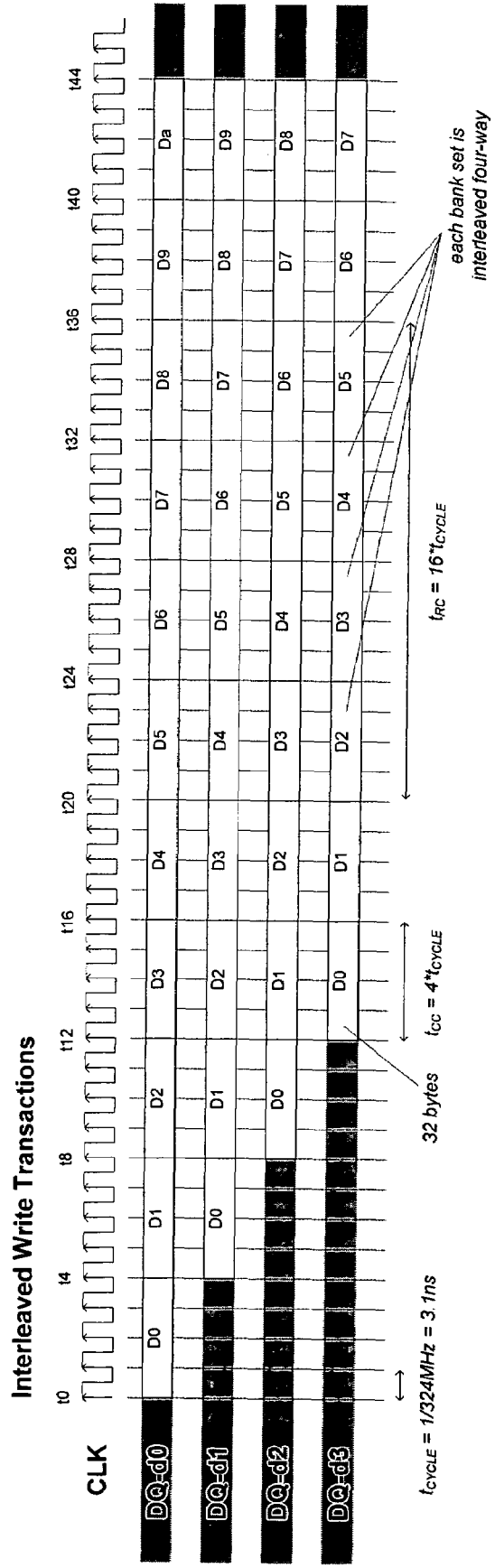
FIG. 20 is a timing diagram illustrating write transactions of the apparatus shown in FIG. 19.

FIG. 20 is a timing diagram illustrating write transactions of apparatus 1990 shown in FIG. 19. A column cycle time $t_{CC}$ is four-cycle times $t_{cycle}$ or approximately 12.4 ns. Accordingly, each write channel 0, 1, 2 and 3 transfers 32 bytes in 12.4 ns, so the aggregate data transfer rate is 2595 MB/s (8*324). In an embodiment of the present invention, the width N of each write channel 0, 1, 2 and 3 is 8 bits that allows for a data rate for each bit to be 2592 Mb/s (8*324). In an alternate embodiment of the present invention, the width N of each write channel 0, 1, 2 and 3 is 16 bits that allows for a data rate for each bit to be 1296 Mb/s (4*324). In an alternate embodiment of the present invention, the width N of each write channel 0, 1, 2 and 3 is 32 bits that allows for a data rate for each bit to be 648 Mb/s (2*324).

As one of ordinary skill in the art would appreciate, adequate bandwidth control of the RQ buses in apparatuses 1390, 1690 and 1990 must be ensured such that read transactions can be completed within an approximate fixed latency, and with the same fixed latency as previous so-called fast cycle, fixed latency memory devices used in a game console. Thus, legacy game software 1201a is able to run on a game console 1200, as seen in FIG. 12, while using the emulating apparatuses 1390, 1690 and 1990 described herein.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An apparatus, comprising:
a first memory device having a first and second memory bank;
a second memory device having a first and second memory bank; and
a master device, coupled to the first and second memory devices, capable of initiating a transfer of data from the first memory device during a constant time interval,
wherein the constant time interval is approximately a fixed latency of a memory device having a single memory bank,
wherein the initiating the transfer of data includes the master device issuing a read command to the first memory device and,
wherein the master device alternates between issuing the read command and a write command to the first memory device.

2. The apparatus of claim 1, wherein the first memory device stores a first set of data at a first address of the first memory bank and a second set of data at a second address of the second memory bank, wherein the second memory device stores a third set of data at a third address of the first memory bank and a fourth set of data at a fourth address of the second memory bank, wherein the first and third sets of data are duplicate data the second and fourth sets of data are duplicate data.

3. The apparatus of claim 1, wherein the master device is a memory controller having a first and second buffer, wherein the first buffer stores a first set of data to be stored in the first memory bank in the first and second memory devices, and the second buffer stores a second set of data to be written to the second memory bank in the first and second memory devices.

4. The apparatus of claim 3, wherein the first and second buffers are circular queues.

5. The apparatus of claim 3, wherein the memory controller is coupled to the first memory device by a first bus and coupled to the second memory device by a second bus.

6. The apparatus of claim 1, wherein the master device initiates a transfer of a first set of data from the first memory device during a first time interval and a transfer of a second set of data from the second memory device during a second time interval, wherein the first time interval precedes the second time interval.

7. The apparatus of claim 1, wherein the master device includes tag memory for identifying whether a set of data stored in the first memory bank of the first memory device is valid.

8. The apparatus of claim 1, wherein the apparatus is included in a game console having a first mode of operation that allows for the apparatus to emulate an operation of a single memory bank memory device.

9. The apparatus of claim 1, wherein the first memory device includes a first and second set of memory banks and the second memory device includes a first and second set of memory banks, and wherein data stored in the first memory device is duplicated in the second memory device.

10. The apparatus of claim 1, wherein the first memory device has a first set of memory banks and the second memory device has a second set of memory banks, the apparatus further comprising:
a third memory device having a third set of memory banks; and
a fourth memory device having a fourth set of memory banks.

11. The apparatus of claim 10, wherein the first, second, third and fourth memory devices are coupled to the master device by a first, second, third and fourth bus, respectively.

12. A game console, comprising:
a first memory device having a first and second memory bank;
a second memory device having a first and second memory bank; and
a master device, coupled to the first and second memory devices, capable to write a first set of data to the first memory device and a second set of data to the second memory device during a mode of operation, wherein the first and second sets of data are duplicates, wherein the master device outputs a read command to the first memory device and alternatively outputs a write command to the second memory device during the mode of operation.

13. The game console of claim 12, further comprising:

a game software; and a mode logic to select the mode of operation responsive to the game software, wherein the first and second sets of data include the game software.

14. The game console of claim 13, wherein the mode logic generates a mode signal responsive to a version of the game software.

15. The game console of claim 13, wherein the mode logic is software.

16. The game console of claim 13, wherein the game console transfers data between the master device and the first and second memory devices during approximately a fixed latency of a memory device having a single memory bank.

17. The game console of claim 13, wherein the game console emulates read and write transactions used for a memory device having a single memory bank.

18. A memory controller, comprising:

a first buffer to output a first set of data to a first memory bank in a first and second memory device; and, a second buffer to output a second set of data to a second memory bank in the first and second memory devices, wherein the memory controller outputs a read command to the first memory device and alternatively outputs a write command to the second memory device.

19. The memory controller of claim 18, wherein the first and second buffers are circular queues.

20. The memory controller of claim 18, further comprising a multiplexer, coupled to the first and second buffers, to output the first and second sets of data to a first and second bus, respectively coupled to the first and second memory devices.

21. The memory controller of claim 18, further comprising:

an address and control logic to output respective addresses associated with the first and second sets of data.

22. The memory controller of claim 18, further comprising:

a tag memory to identify valid data in the first and second memory devices.

23. The memory controller of claim 18, wherein the first memory bank is included in a first set of memory banks in the first memory device and the second memory bank is included in a second set of memory banks in the second memory device, the memory controller further comprising:

a third buffer to output a third set of data to a third memory device having a third set of memory banks; and a fourth buffer to output a fourth set of data to a fourth memory device having a fourth set of memory banks.

24. The memory controller of claim 18, wherein the memory controller transfers data between the memory controller and the first and second memory devices during approximately a fixed latency of a memory device having a single memory bank.

25. A method comprising:

writing a first set of data to a first memory bank in a first memory device during a first time interval;

writing the first set of data to a first memory bank in a second memory device during the first time interval;

writing a second set of data to a second memory bank in the first memory device during a second time interval;

writing the second set of data to a second memory bank in the second memory device during the second time interval, wherein the first and second sets of data stored in the first memory device are a duplicate of the first and second sets of data stored in the second memory device, and wherein the first time interval is different than the second time interval;

reading the first set of data during a first constant time interval, wherein the first constant time interval is approximately a fixed latency of a memory device having a single memory bank; and reading the second set of data during a second constant time interval, wherein the second constant time interval is approximately the same as the first constant time interval, wherein the writing to the first memory device is alternated with the reading from the second memory device.

26. The method of claim 25, wherein the writing the first set of data includes buffering the first set of data in a first buffer and the writing the second set of data includes buffering the second set of data in a second buffer.

27. The method of claim 26, wherein the first and second buffers are in a memory controller.

28. The method of claim 26, further comprising:

identifying valid data stored at a first address in the first memory bank of the first memory device.

29. The method of claim 26, wherein the first and second sets of data are obtained from game software.

30. The method of claim 26, wherein the first memory bank in the first memory device is included in a first set of memory banks, wherein the second memory bank in the first memory device is included in a second set of memory banks, wherein the first memory bank in the second memory device is included in a third set of memory banks, wherein the second memory bank in the second memory device is included in a fourth set of memory banks.

31. A method comprising:

writing a first set of data to a first memory bank in a first memory device during a first time interval;

writing a second set of data to a second memory bank in the first memory device during the first time interval;

writing a third set of data to a first memory bank in a second memory device during a second time interval;

writing a fourth set of data to a second memory bank in the second memory device during the second time interval, wherein the first, second, third and fourth sets of data are duplicates, reading from the first memory device during a first constant time interval, wherein the first constant time interval is approximately a fixed latency of a memory device having a single memory bank; and reading from the second memory device during a second constant time interval, wherein the second constant time interval is approximately the same as the first constant time interval, wherein the writing to the first memory device is alternated with the reading from the second memory device.

32. A method comprising:

writing a first set of data to a first memory bank in a first memory device during a first time interval;

writing the first set of data to a second memory bank in the first memory device during a second time interval;

writing a first set of data to a first memory bank in a second memory device during a third time interval;

writing the first set of data to a second memory bank in the second memory device during a fourth time interval, wherein the first, second, third and fourth time intervals are different, reading from the first memory device during a first constant time interval, wherein the first constant time interval is approximately a fixed latency of a memory device having a single memory bank; and reading from the second memory device during a second constant time interval, wherein the second constant time interval is approximately the same as the first constant time interval, wherein the writing to the first memory device is alternated with the reading from the second memory device.

33. A method comprising:

writing a first set of data to a first memory bank in a first memory device during a first time interval;

writing the first set of data to a second memory bank in the first memory device during the first time interval;

writing the first set of data to a first memory bank in a second memory device during a second time interval;

writing the first set of data to a second memory bank in the second memory device during the second time interval, wherein the first and second time intervals are different;

reading from the first memory device during a first constant time interval, wherein the first constant time interval is approximately a fixed latency of a memory device having a single memory bank; and reading from the second memory device during a second constant time interval, wherein the second constant time interval is approximately the same as the first constant time interval, wherein the writing to the first memory device is alternated with the reading from the second memory device.

34. The method of claim 33, wherein a first and second bus is used.

35. A method comprising:

writing a first set of data to a first memory bank in a first plurality of memory banks in a first memory device during a first time interval;

writing the first set of data to a first memory bank in a first plurality of memory banks in a second memory device during a second time interval;

writing the first set of data to a first memory bank in a first plurality of memory banks in a third memory device during a third time interval;

writing the first set of data to a first memory bank in a plurality of memory banks in a fourth memory device during a fourth time interval, wherein the first, second, third and fourth time intervals are different, reading from the first memory device during a first constant time interval, wherein the first constant time interval is approximately a fixed latency of a memory device having a single memory bank;

reading from the second memory device during a second constant time interval;

reading from the third memory device during a third constant time interval; and reading from the fourth memory device during a fourth constant time interval, wherein the first, second, third and fourth constant time intervals are approximately the same, wherein the writing to the first memory device is alternated with the reading from the second memory device.

36. The method of claim 35, wherein a first, second, third and fourth bus is used.

37. A memory apparatus, comprising:

a first memory device having a first and second memory bank;

a second memory device having a first and second memory bank; and means for transferring data from the first memory device during a constant time interval, wherein the constant time interval is approximately a fixed latency of a memory device having a single memory bank, wherein means for transferring data includes means for issuing a read command to the first memory device and alternatively issuing a write command to the second memory.

* * * * *